United States Patent
Swaminathan et al.

(10) Patent No.: US 9,265,170 B2
(45) Date of Patent: Feb. 16, 2016

(54) INTEGRATED CIRCUIT CONNECTORS

(71) Applicant: INTEL CORPORATION, Santa Clara, CA (US)

(72) Inventors: Rajasekaran Swaminathan, Tempe, AZ (US); Ram S. Viswanath, Phoenix, AZ (US); Sanka Ganesan, Chandler, AZ (US); Gaurav Chawla, Tempe, AZ (US); Joshua D. Heppner, Chandler, AZ (US); Jeffory L. Smalley, East Olympia, WA (US); Vijaykumar Krithivasan, Chandler, AZ (US); David J. Llapitan, Tacoma, WA (US); Neal E. Ulen, Yelm, WA (US); Donald T. Tran, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/065,281

(22) Filed: Oct. 28, 2013

(65) Prior Publication Data
US 2015/0118870 A1 Apr. 30, 2015

(51) Int. Cl.
*H01R 12/00* (2006.01)
*H05K 1/00* (2006.01)
*H05K 7/10* (2006.01)
*H01R 12/71* (2011.01)
*H01R 13/24* (2006.01)

(52) U.S. Cl.
CPC ............ *H05K 7/10* (2013.01); *H01R 12/00* (2013.01); *H01R 12/716* (2013.01); *H05K 1/00* (2013.01); *H01R 13/2442* (2013.01)

(58) Field of Classification Search
CPC ............ H01R 12/00; H05K 1/00; H05K 7/00
See application file for complete search history.

(56) References Cited

U.S. PATENT DOCUMENTS

| | | | | |
|---|---|---|---|---|
| 5,205,741 A * | 4/1993 | Steen et al. | | 439/70 |
| 5,383,787 A * | 1/1995 | Switky et al. | | 439/67 |
| 5,980,267 A * | 11/1999 | Ayers et al. | | 439/60 |
| 6,144,559 A * | 11/2000 | Johnson et al. | | 361/760 |
| 6,347,946 B1 * | 2/2002 | Trobough et al. | | 439/70 |
| 6,859,854 B2 * | 2/2005 | Kwong | | 710/315 |
| 2003/0211784 A1 * | 11/2003 | Wu et al. | | 439/638 |
| 2009/0073466 A1 * | 3/2009 | Awata et al. | | 358/1.9 |
| 2014/0268577 A1 | 9/2014 | Swaminathan et al. | | |
| 2014/0273555 A1 | 9/2014 | Chawla et al. | | |
| 2014/0322932 A1 * | 10/2014 | Tran et al. | | 439/59 |

OTHER PUBLICATIONS

TE Connectivity Ltd. company, "STRADA Whisper Backplane Connector" 2012, p. 1-4.

* cited by examiner

*Primary Examiner* — Abdullah Riyami
*Assistant Examiner* — Harshad Patel
(74) *Attorney, Agent, or Firm* — Schwabe, Williamson & Wyatt, P.C.

(57) ABSTRACT

Embodiments related to integrated circuit (IC) connectors are described. In some embodiments, an IC assembly may include an IC package substrate, an intermediate member, and a male connector. The IC package substrate may have first signal contacts on a top or bottom surface, and the bottom surface may have second signal contacts for coupling with a socket on a circuit board. The intermediate member may have a first end coupled to the first signal contacts and a second end extending beyond the side surface. The male connector may be disposed at the second end of the intermediate member, and may have signal contacts coupled to the signal contacts of the intermediate member. The male connector may be mateable with a female connector when the female connector is brought into engagement in a direction parallel to the axis of the intermediate member. Other embodiments may be disclosed and/or claimed.

10 Claims, 14 Drawing Sheets

INTEGRATED CIRCUIT CONNECTORS

TECHNICAL FIELD

The present disclosure relates generally to the field of integrated circuits, and more particularly, to integrated circuit connectors.

BACKGROUND

Some integrated circuit (IC) assemblies route signals from dies or other components in an IC package through a socket and into a circuit board (e.g., a motherboard), then route these signals out of the circuit board to other devices via an intermediate connector. This arrangement may introduce losses at each interface, and may require extensive retooling and specialized connectors in order to increase the number of signals that can be routed to and from the IC package.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
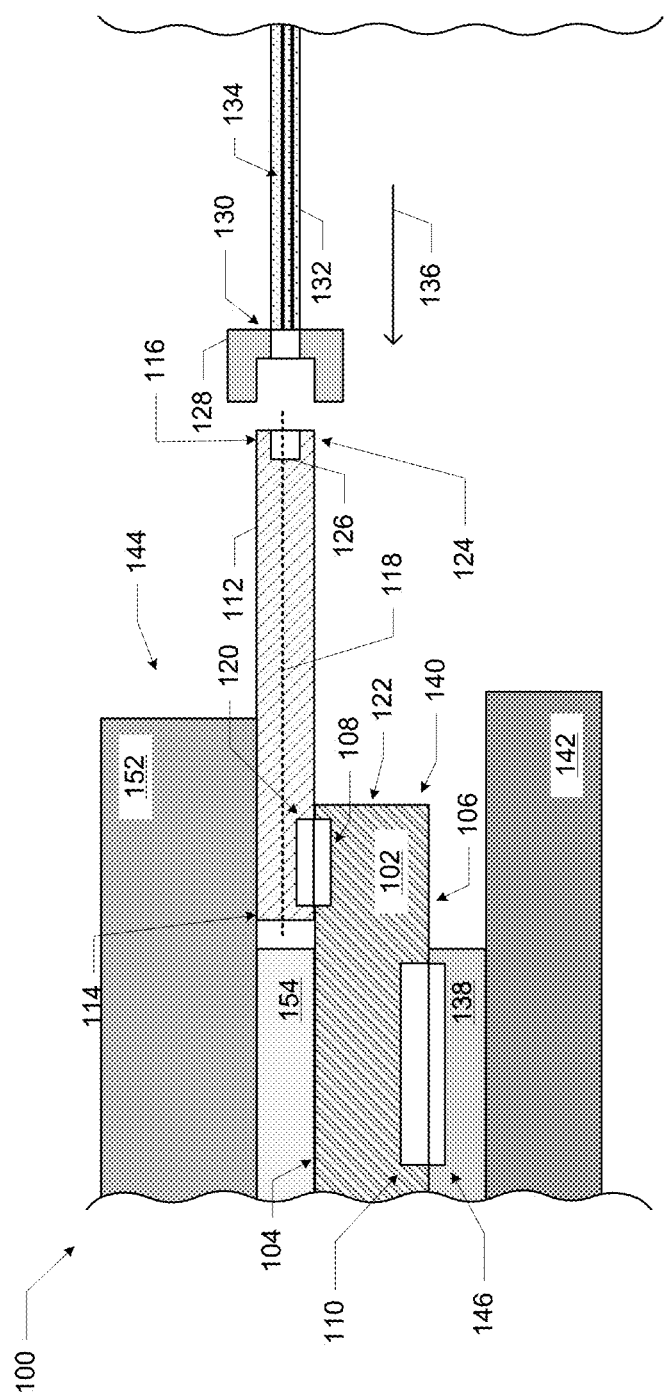
FIGS. 1 and 2 are schematic cross-sectional views of integrated circuit (IC) assemblies, in accordance with various embodiments.

Embodiments related to integrated circuit (IC) connectors are described. In some embodiments, an IC assembly may include an IC package substrate, an intermediate member, and a male connector. The IC package substrate may have a top surface, a bottom surface, and a side surface, with first signal contacts on the top surface or the bottom surface, and the bottom surface having second signal contacts for coupling with a socket on a circuit board. The intermediate member may have a first end and a second end, an axis defined between the first and second ends, with the first end having signal contacts coupled to the first signal contacts of the IC package substrate, and the second end extending beyond an edge of the IC package substrate defined by the side surface. The male connector may be disposed at the second end of the intermediate member, and may have signal contacts coupled to the signal contacts of the intermediate member. The male connector may be mateable with a female connector when the female connector is brought into engagement with the male connector in a direction parallel to the axis.

In some embodiments, an IC connector may include a mechanical mating feature proximate to a first side surface, complementary to a mechanical mating feature proximate to a side surface of a socket for an IC package substrate, such that the IC connector may be disposed adjacent to the side surface of the socket when mated with the socket. A cable receptacle may be disposed on the top or bottom surface of the IC connector to receive a cable having signal contacts coupled with signal carriers. The signal carriers may extend beyond an edge defined by the second side surface and the signal contacts may be coupled with signal contacts on a bottom surface of the IC package substrate when the IC package substrate is seated in the socket, the IC connector and the socket are mated, and the cable is disposed in the cable receptacle.

The embodiments disclosed herein may provide a number of advantages over existing technology. For example, some of the embodiments disclosed herein (e.g., the embodiments of FIGS. 1, 2, 4 and 5) may be advantageous in fabric-based computing systems. Fabric-based computing systems may be particularly useful in scalable server architectures using advanced memory and storage hierarchies. Some such computing systems may be configured for 25 gigabits per second (Gbps) signaling from a central processing unit (CPU) package. Fabric signaling may enable switch channels for high performance computing (HPC) systems to operate at high speeds (e.g., transfer rates of 100 gigatransfers per second (GT/s) or greater). Some fabric-based systems may require long-hop signaling capability (e.g., signaling with carrier lengths approximately 18 inches or greater), which may be difficult to achieve at adequate performance levels with current through-socket technology. As used herein, "through-socket technology" may include technologies in which signals from a die or other component of an IC package substrate are routed through a socket, into a circuit board on which the socket is mounted (such as a motherboard), out of the circuit board, into a cable connector, and then through the cable to another component (such as a CPU mounted on another circuit board). A signal routed in this manner may be degraded at each interface, and thus existing through-socket technology may unacceptably degrade the signal in some applications (e.g., in high speed applications such as fabric-based or other HPC applications).

Various ones of the embodiments disclosed herein may provide advantages in IC signaling applications, such as fabric computing applications. Some embodiments may enable an adaptable interconnect topology that can couple various CPU board layouts and designs, in fabric and non-fabric topologies. This may allow more rapid development and validation of new structures. Some embodiments disclosed herein may provide "on-package technology," which may be distinguished from through-socket technology by not requiring that signals from components of an IC package substrate be routed through a socket and circuit board; instead, these signals may be provided directly to a cable connector and routed through the cable to another component. The on-package embodiments disclosed herein may reduce or eliminate the losses associated with routing through multiple interfaces associated with circuit board mounting. In particular, some such embodiments may significantly reduce insertion losses by enabling on-package interconnects (through coaxial cable or flex cable, for example) between CPUs or between a CPU and a switch.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the disclosed embodiments. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous.

The description may use perspective-based descriptions such as up/down, back/front, and top/bottom. Such descriptions are merely used to facilitate the discussion and are not intended to restrict the application of disclosed embodiments. In particular, the use of the terms "top" and "bottom" in this description is for illustrative purposes only, and the arrangement of IC connector, cable, and IC package substrate may be reoriented in any desired manner (e.g., rotated in any direction by 90, 180, or any desired number of degrees).

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

Figure 2:
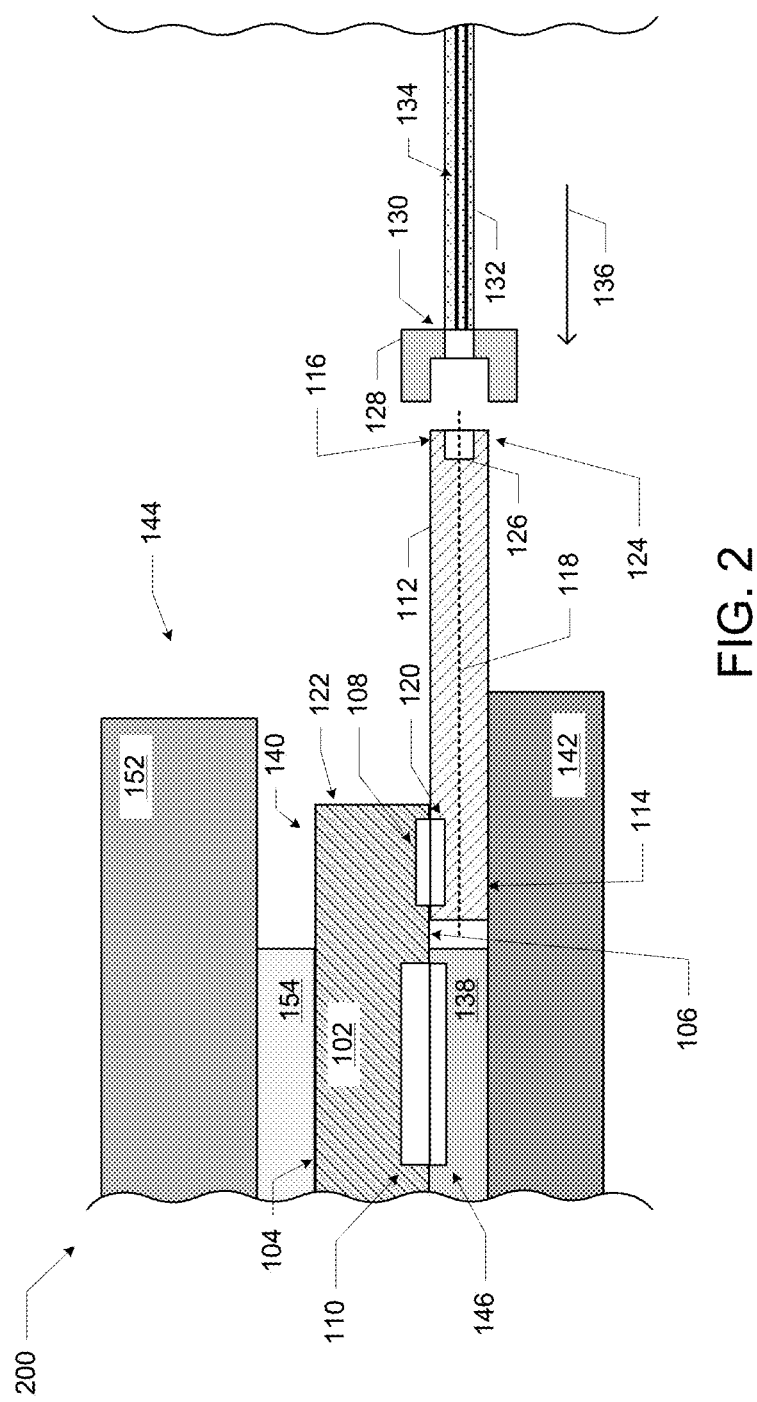

FIGS. 1 and 2 are schematic cross-sectional views of IC assemblies 100 and 200, respectively. In FIG. 1, the IC assembly 100 may include an IC package substrate 102 having a top surface 104, a bottom surface 106 and a side surface 122. The IC package substrate 102 has first signal contacts 108 on the top surface 104, and second signal contacts 110 on the bottom surface 106. Signal contacts on an IC package substrate may be used to route signals (e.g., electrical and/or optical signals) to and/or from components included in the IC package substrate, such as dies or other IC devices. The IC package 102 may be configured to seat in a socket 138 mounted on a circuit board 142. The circuit board 142 may be, for example, a motherboard. The second signal contacts 110 on the bottom surface 106 of the IC package substrate 102 may couple with corresponding signal contacts 146 of the socket 138, which may route signals (not shown) from the IC package substrate 102 through the socket 138 and to the circuit board 142 in any conventional manner. Any suitable number of contacts may be included in the signal contacts 108 and 110. For example, in some embodiments, 128 signal contacts or more may be provided in the signal contacts 108. In some embodiments, 336 signal contacts or more may be provided in the signal contacts 108.

The IC assembly 100 may include an intermediate member 112. The intermediate member 112 may have a first end 114 and a second end 116. An axis 118 may be defined between the first end 114 and the second end 116. The intermediate member 112 may have signal contacts 120 at the first end 114. The signal contacts 120 may be coupled to the first signal contacts 108 of the IC package substrate 102. In some embodiments, the intermediate member 112 may include a flexible flat cable. In some embodiments, the intermediate member 112 may include a rigid circuit board.

The IC assembly 100 may include a male connector 124 disposed at the second end 116 of the intermediate member 112. The male connector 124 may include signal contacts 126. The signal contacts 126 may be coupled to the signal contacts 120 of the intermediate member 112 (e.g., via signal carriers, not shown). Any of the signal carriers discussed herein may include printed traces, optical fibers, wires, or any other suitable signal carriers. In some embodiments, the intermediate member 112 may be formed from a rigid circuit board, and the male connector 124 may be formed from an extension portion of the rigid circuit board. Examples of such embodiments are discussed below with reference to FIG. 3.

The male connector 124 may be mateable with a female connector 128 when the female connector 128 is brought into engagement with the male connector in a direction 136 parallel to the axis 118. The female connector 128 may include signal contacts 130, which couple to the signal contacts 126 of the male connector 124 when the female connector 128 and the male connector 124 are engaged. In some embodiments, the female connector 128 may be a low insertion force (LIF) connector.

The female connector 128 may be coupled with a cable 132, which may include signal carriers 134 coupled to the signal contacts 130 of the female connector 128. The cable 132 may extend in a direction parallel to the axis 118 when the female connector 128 and the male connector 124 are engaged. In some embodiments, the cable 132 may include a coaxial cable. Some coaxial cables may have an outer diameter approximately equal to or greater than two millimeters (for example, greater than 2.5 millimeters). In some embodiments, the cable 132 may include a microcoaxial cable, which may include coaxial cables having an outer diameter of one millimeter or less. In some embodiments, a microcoaxial cable may have an outer diameter of approximately 0.25 millimeters or greater. In some embodiments, a microcoaxial cable included in the cable 132 may have an outer diameter of approximately one millimeter. In some embodiments, the cable 132 may include a fiber optic cable. In such embodiments, the male connector 124 and the female connector 128 may provide an optical interface, instead of or in addition to an electrical interface. In some embodiments, the cable 132 may connect the IC package substrate 102 to a switch (not shown), which may be a communication hub for a server farm or other network of computing devices. For example, the switch (not shown) may in turn be coupled with one or more processing units (such as one or more central processing units (CPUs)).

The second end 116 of the intermediate member 112 may extend beyond an edge of the IC package substrate 102 defined by the side surface 122 of the IC package substrate 102. In some embodiments, the intermediate member 112 may be dimensioned to extend past a heat management component (HMC) 144 coupled to the IC package substrate 102. The HMC 144 may include an integrated heat spreader (IHS) 154, a thermal interface material (TIM, not shown), a heat sink 152, any other heat management component, or any combination of the foregoing. This may enable easier connection and disconnection between the male connector 124 and the female connector 128 by moving the connection point away from sensitive IC components.

In some embodiments, the IC package substrate 102 may include a structure referred to as a "diving board." An example is shown as the diving board 140. When the IC package substrate 102 is coupled with the socket 138 on the circuit board 142, the diving board 140 may extend away from the socket 138, and may provide space for signal contacts on a top or bottom surface of the IC package substrate 102 (e.g., the first signal contacts 108 of FIG. 1 on a top surface 104 of the IC package substrate 102). In some embodiments, a HMC 144 may extend to cover the diving board 140, as shown in FIG. 1.

In FIG. 2, the IC assembly 200 may be substantially identical to the IC assembly 100, except that the first signal contacts 108 of the IC package substrate 102 are on the bottom surface 106 of the diving board 140 of the IC package substrate 102 instead of on the top surface 104. Any of the embodiments discussed above with reference to the IC assembly 100 may similarly apply to the IC assembly 200.

Figure 3:
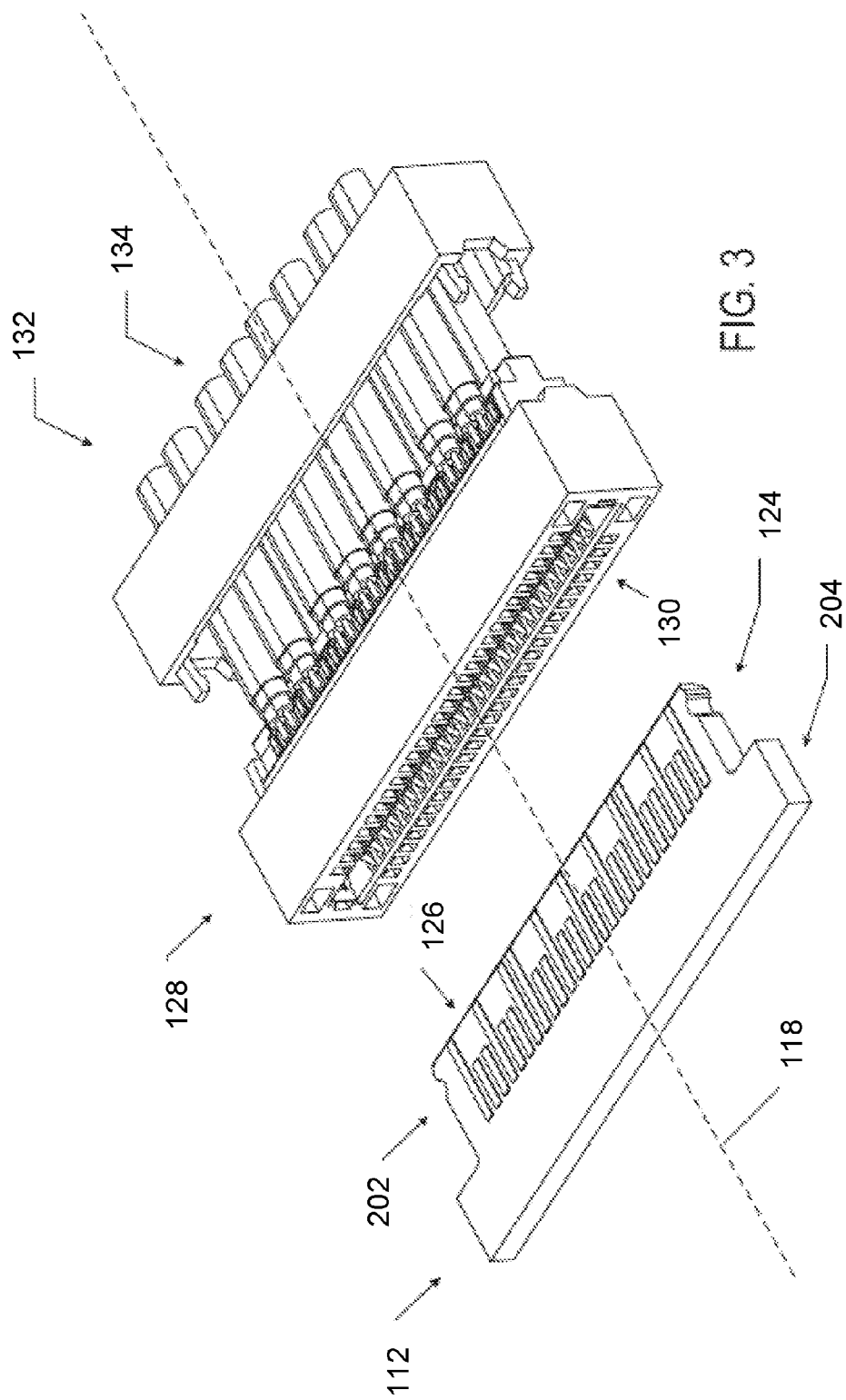
FIG. 3 is a perspective view of a male connector that may be included in the IC assemblies of FIGS. 1 and 2, and a female connector that may mate with the male connector, in accordance with various embodiments.

FIG. 3 is a perspective view of an embodiment of the male connector 124, which may be included in the IC assemblies 100 and 200 of FIGS. 1 and 2. In FIG. 3, the male connector 124 may be formed from an extension portion 202 of the intermediate member 112. The extension portion 202 may extend away from a body 204 of the intermediate member 112 in a direction of the axis 118. Such an embodiment may be particularly suitable when the intermediate member 112 is a rigid circuit board. The signal contacts 126 of the male connector 124 may be printed on the extension portion 202.

FIG. 3 also depicts an embodiment of the female connector 128 that may mate with the male connector 124. The female connector 128 may include the signal contacts 130, which may be coupled with a number of signal carriers 134 that form a cable 132 extending away from the male connector 124 parallel to the axis 118.

Various embodiments of the IC assemblies disclosed herein (such as the IC assemblies of FIGS. 1 and 2) may improve on existing technology in any of a number of ways. In particular, users of existing technology are often required to trade ease of connector assembly/disassembly for the number of available signal pathways. For example, designers of IC application which require only a few signal pathways may use edge-based connectors, which may be easier to assemble and disassemble than connectors that mate with the top or bottom surface of an IC package substrate. However, mating on a top or bottom surface may be desirable for applications in which greater numbers of signal pathways (and/or a greater signal density) are desired.

The assemblies discussed above with reference to FIGS. 1 and 2 may standardize the mating interface between IC package substrates and cables (e.g., coaxial cables), enabling a common interface to be used for various arrangements and form factors of the components of the IC package substrates and other components of an IC device (e.g., a motherboard and a heat sink). Because such connectors enable signal transfer from the IC package substrate without requiring additional sockets on a circuit board (e.g., a motherboard), manufacturers need not retool their socket equipment to improve the performance (e.g., by increasing the signal density) of the IC package substrate. This may speed development and reduce cost.

Figure 4:
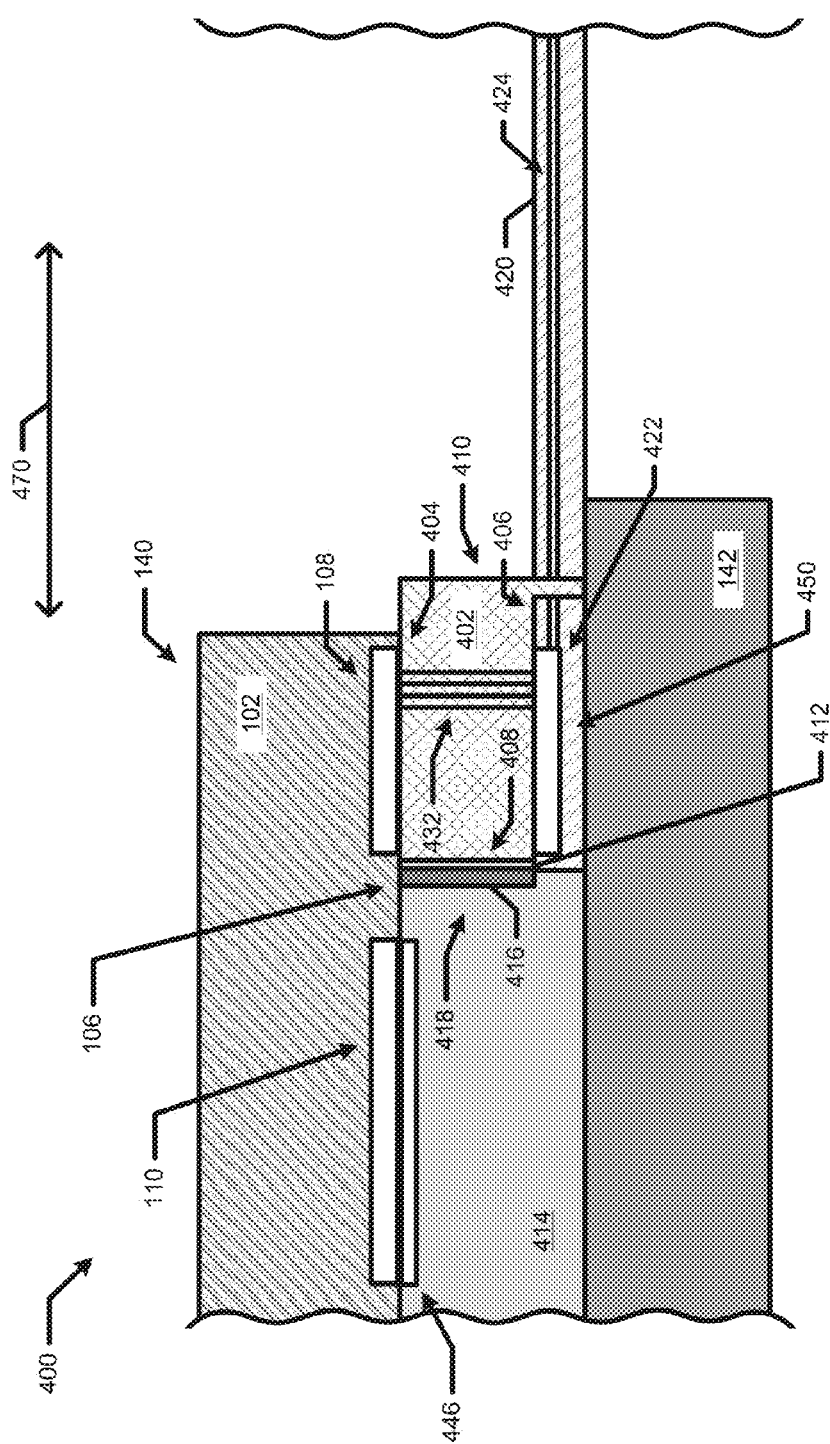
FIGS. 4 and 5 are schematic cross-sectional views of IC connectors mated with a socket in IC assemblies, in accordance with various embodiments.
Figure 5:
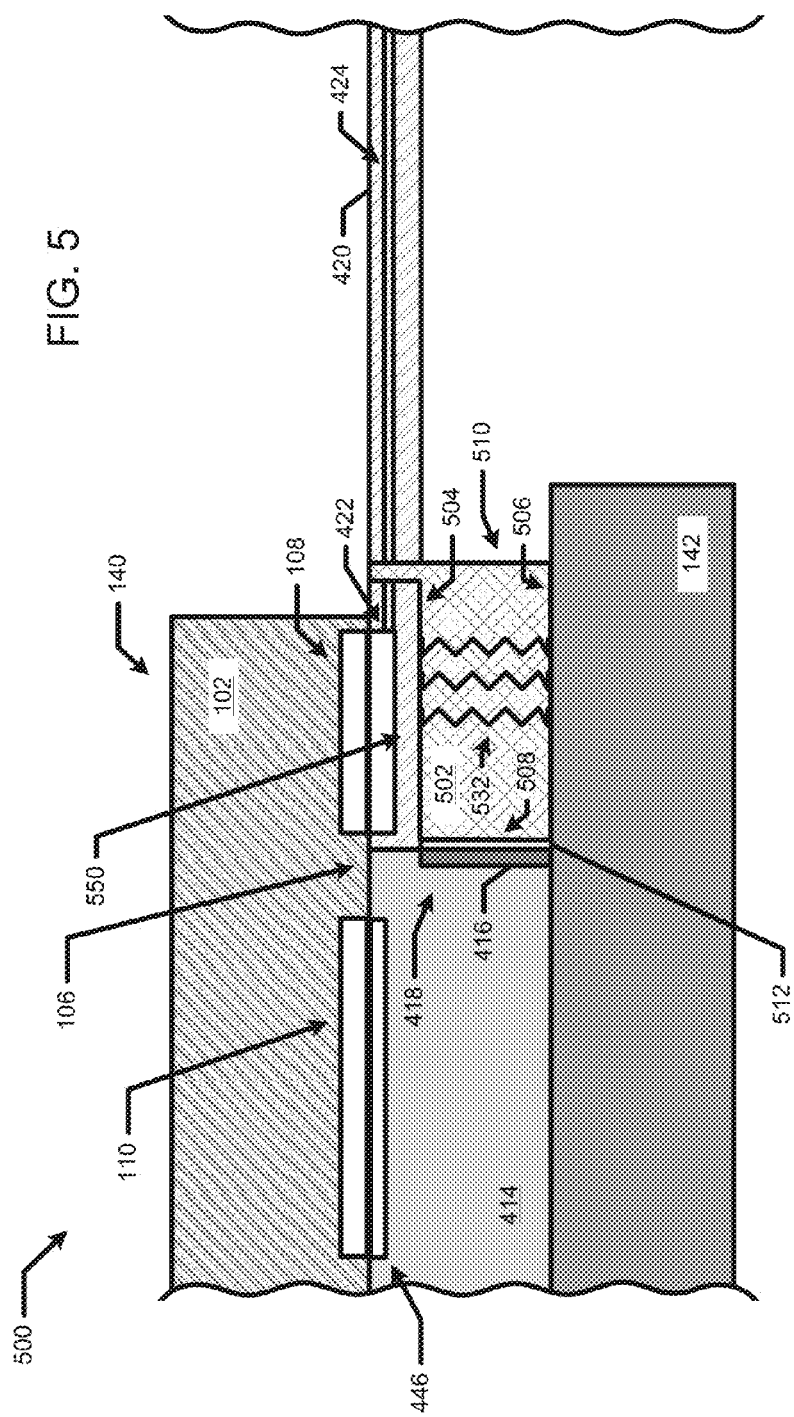

FIGS. 4 and 5 are schematic cross-sectional views of IC connectors 402 and 502 mated with a socket 414 in IC assemblies 400 and 500, respectively. In FIG. 4, the IC connector 402 may have a top surface 404, a bottom surface 406, a first side surface 408 and a second side surface 410. In some embodiments, the second side surface 410 is disposed opposite to the first side surface 408. The IC connector 402 may include a mechanical mating feature 412 proximate to the first side surface 408. The mechanical mating feature 412 may be complementary to a mechanical mating feature 416 proximate to a side surface 418 of the socket 414. The IC package substrate 102 may seat in the socket 414. As shown in FIG. 4, the IC connector 402 may be disposed adjacent to the side surface 418 of the socket 414 when the IC connector 402 and the socket 414 are mated. The IC package substrate 102 may include the diving board 140, as discussed above with reference to FIGS. 1 and 2. The IC package substrate 102 may also include signal contacts 110, which may couple with signal contacts 446 of the socket 414 when the IC package substrate 102 is seated in the socket 414. The socket 414 may route signals (not shown) from the IC package substrate 102 through the socket 414 and to the circuit board 142 in any conventional manner.

As noted above, the IC connector 402 may be configured to mate with the socket 414 on the circuit board 142 via complementary mechanical mating features. The IC connector 402 may thus be configured to "snap" into the socket 414 such that, when the IC package substrate 102 is seated in the socket 414, the IC connector 402 is positioned under the signal contacts 108 of the IC package substrate 102. Thus, unlike the socket 414, the IC connector 402 is not solder mounted on the circuit board 142. In some embodiments, the signal contacts 108 may be located on the diving board 140 of the IC package substrate 102. Since the IC connector 402 is mechanically coupled to the socket 414, and since signals from the IC package substrate 102 are routed to the cable 420 without going through the circuit board 142, the IC connector 402 need not be surface mounted to the circuit board 142.

A cable receptacle 450 may be disposed on the bottom surface 406 of the IC connector 402. The cable receptacle 450 may be configured to receive a cable 420. In some embodiments, the cable receptacle 450 may include a channel, hole, or other area in which the cable 420 may be received. In some embodiments, the total height of the IC connector 402 may be smaller than the distance between the circuit board 142 and the bottom surface 106 of the IC package substrate 102 in order to accommodate the thickness of the cable 420. Dimensions of the IC connector 402 may be chosen as suitable for any particular application. In some embodiments, the IC connector 402 may have a height of approximately 2.2 millimeters, while the socket 414 may have a height of approximately 2.7 millimeters.

In some embodiments, the cable receptacle 450 may secure the cable 420 to the IC connector 402. In some embodiments, the cable receptacle 450 may not secure the cable 420 to the IC connector 402, but may cooperate with other components of the IC assembly 400 (e.g., the circuit board 142) to secure the cable 420 to the IC assembly 400 (e.g., by compression and/or friction). In some embodiments, a stiffener plate (not shown) may be positioned between the circuit board 142 and the cable 420, and may aid the IC connector 402 in sandwiching and securing the cable 420. In some embodiments, a stiffener plate may have a height of approximately 0.3 millimeters.

The cable 420 may include signal contacts 422 coupled with signal carriers 424. The signal contacts 422 may be coupled with signal contacts 108 on a bottom surface 106 of the IC package substrate 102 when the IC package substrate 102 is seated in the socket 414, the IC connector 402 and the socket 414 are mated, and the cable 420 is disposed in the cable receptacle 450. The signal carriers 424 may extend beyond an edge defined by the second side surface 410. In some embodiments, the cable 420 may include an interposer or flexible cable, and may itself be attached to a low loss cable (e.g., a coaxial cable) at a location distal to the IC connector 402. In some embodiments, the cable 420 may itself be a low loss cable, such as a coaxial cable.

Figure 12:
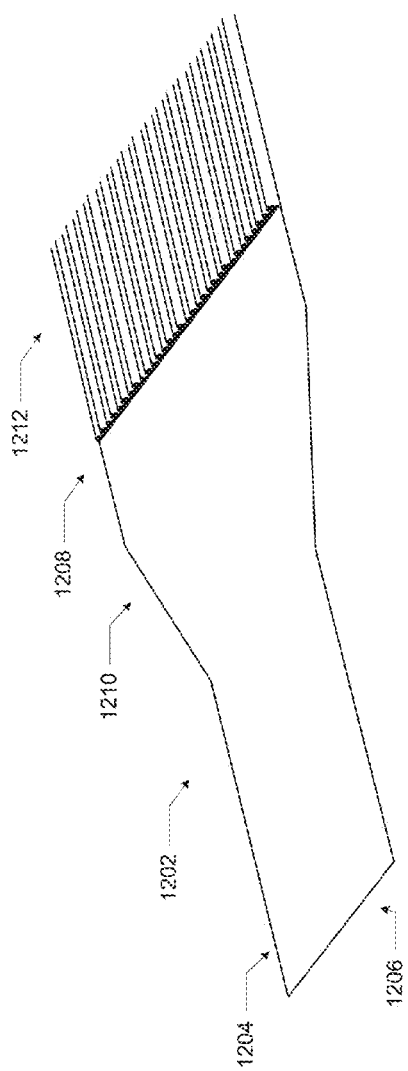
FIG. 12 is a perspective view of a bump-on-flex cable, in accordance with various embodiments.

In some embodiments, the signal contacts 422 of the cable 420 may include bump-on-flex contacts. As used herein, "bump-on-flex" may refer to signal contacts in which signal contacts may be arranged on a relatively flat surface of a flexible cable, and coupled with signal carriers extending through the flexible cable. A perspective view of a bump-on-flex arrangement is shown in FIG. 12. A bump-on-flex arrangement may be contrasted with an edge-based arrangement in which the signal contacts extend from the edge of a flexible cable. In some embodiments, the signal contacts 422 may be electrically conductive contacts, and may be formed from a conductive material such as copper, gold, or a solder material. The signal contacts 422 may be any suitable dimension. For example, each of the signal contacts 422 may have a diameter of approximately 200 microns, and a height of approximately 100 microns. In some embodiments, the cable 420 may include a polyimide film, and the signal carriers 424 may be printed on or otherwise arranged on or in the polyimide film.

In some embodiments, the IC connector 402 may include signal pathways for routing signals between the IC package substrate 102 and the cable 420. In particular, the IC connector 402 may include signal carriers 432 which may be disposed between the signal contacts 422 of the cable 420 and the signal contacts 108 of the IC package substrate 102 when the IC package substrate 102 is seated in the socket 414, and may couple the IC package substrate 102 and the cable 420 when the IC package substrate 102 is so seated.

In some embodiments, the signal carriers 432 included in the IC connector 402 may be in physical contact with the signal contacts 108 on the bottom surface 106 of the IC package substrate 102. For example, the signal contacts 108 on the bottom surface 106 of the IC package substrate 102 may include lands on the bottom surface of a diving board 140, and the signal carriers 432 in the IC connector 402 may make physical contact with these lands. The coupling between the signal carriers 432 in the IC connector 402 and the signal contacts 108 on the bottom surface 106 of the IC package substrate 102 may take any suitable form, including structures typically used to make signal connections between the IC package substrate 102 and the socket 414. In some embodiments, the signal carriers 432 may be disposed substantially parallel to the first side surface 408.

In some embodiments, the signal carriers 432 may include a land grid array (LGA) contact. LGA contacts may be selected to meet desired height, pitch, deflection and force requirements. For example, in some embodiments, 1.5 millimeter or 2.2 millimeter LGA contacts may be used, each having a cantilever top contact and a solder ball mounted on a bottom surface for coupling with a signal contact of the cable. LGA contacts may be able to achieve pitches of 0.65-0.75 millimeters and below, and thus may be preferable to low insertion force (LIF) contacts (which have not shown scaling capability much below 0.8 millimeters).

In some embodiments, the signal carriers 432 may include a vertical contact. As used herein, a "vertical contact" may include a spring element arranged to apply a spring force to another element in an IC structure (e.g., the cable 420, which may include a flexible cable with or without bump-on-flex contacts). In conjunction with other structures, the spring force applied by the vertical contact may mechanically secure the element within the IC structure. The vertical contact may also provide a signal contact for transmitting signals between two elements via the IC connector 402. Examples of vertical contacts into pogo pins and dual beam vertical contacts. Vertical contacts may be easier to shield from electromagnetic interference than LGA contacts, and thus may be provide better performance in certain applications. The electrical pins of certain LGA contacts may be susceptible to the risk of being bent during handling; vertical contacts may reduce this risk. Additionally, vertical contacts may reduce the achievable pitch below that of LGA contacts (e.g., 0.4 millimeters and below), and thus more signaling pathways may be accommodated (e.g., 400 pins or beyond). Having signal carriers of reduced pitch may allow the signal contacts on the IC package substrate 102 and/or the cable to be reduced in area, which may mitigate capacitive effects and reduce cost. In some embodiments, the vertical contacts used in the connector are of a dual-compression type. Dual compression contacts may not have either tip soldered to another component, unlike many conventional contacts in which one end is soldered to a circuit board (e.g., a motherboard); instead, the electrical connection on both ends of the contact may be established and maintained by the force between contacting surfaces.

Dimensions of the IC assembly 400 may be selected as suitable for various applications. In some embodiments, the IC package substrate 102 may have a length of approximately 76 millimeters in the direction indicated by the arrow 470. The portion of the IC package substrate 102 corresponding to the diving board 140 may have a length that is less than or equal to 25 millimeters. In some embodiments, an IHS (not shown) may be disposed above the IC package substrate 102 and may extend onto the diving board 140 or may stop short of the diving board 140. In some embodiments, the IHS may extend approximately 13 millimeters onto the diving board 140. A heat sink (not shown) may be disposed above the IHS, and may be approximately 110 millimeters long.

In some applications, IC connectors on the bottom surface of an IC package substrate (such as the IC connectors of FIG. 4, discussed above, and FIG. 5, discussed below) may have a number of advantages over IC connectors on the top surface or the side surface of an IC package substrate. Because a heat sink is typically mounted on the top surface of an IC package substrate with a thermal interface material (TIM), an IC connector on that top surface may be inaccessible after heat sink assembly. To address this inaccessibility, an additional separable connector may couple the IC package substrate and the cable further away from the heat sink, but this additional connector introduces another lossy interface through which the signal must flow. Some TIMs are paste- or grease-like materials configured to provide good thermal coupling between the IC package substrate and the heat sink. If the connector or cable is damaged in the field, the operator must disconnect the cable, pull the IC package substrate from the socket, take it to a table, remove the heat sink, contain the TIM, rework the connector if it is surface mounted or otherwise remove it, reapply the TIM, reassemble the heat sink, reseat the IC package substrate in the socket, and reconnect the cable. This process is time-consuming and likely to result in contamination of the signal contacts with the TIM, which may reduce reliability.

Additionally, since components on the top surface of an IC package substrate are typically mounted by the original equipment manufacturer (OEM), having a connector on the top surface may require the OEM to handle both the connector (with its attached cable) and the heat sink during assembly. Since the cable will be loose before the connector is coupled to the top surface of the IC package substrate, the risk of snagging the cable on other components during assembly is raised and reliability is reduced. Connectors on the top surface of an IC package substrate may experience load loss on the signal contacts due to the moment induced when the connector is loaded.

With respect to connectors that are positioned on a side surface of an IC package substrate, the number of signal pathways available through such connectors (usually arranged in two parallel rows of contacts) is typically limited by the depth of the IC package substrate. As IC devices become smaller, the surface area available for signal contacts on a side surface of an IC package substrate is also reduced. Because current and future IC devices require both more signal pathways and more corresponding ground connections, side surface connectors may not be able to meet the performance requirements for such current and future devices.

In contrast, IC connectors on the bottom surface of an IC package (such as the IC connectors of FIGS. 4 and 5) may be advantageous in that it is not necessary to disassemble the heat sink and other components on the top surface of the IC package substrate in order to access the connector. The IC connector may be installed, and its associated cable routed and secured appropriately, before reaching the OEM, which may reduce the steps the OEM must take in positioning the cable and reduce the risk of snagging. As compared to side surface IC connectors, bottom surface IC connectors may be readily scaled to accommodate many signal pathways, and may utilize all of the available space under the IC package substrate next to the connector, if desired.

Additionally, since much test equipment is configured to couple with socket signal contacts on a bottom surface of an IC package substrate, this same test equipment may be readily extended to couple with additional signal contacts on the bottom surface of the IC package substrate in accordance with some of the embodiments disclosed herein, and thus minimal re-tooling is required (as compared to the re-tooling required to test additional signal contacts positioned on a top or side surface of the IC package substrate). Moreover, in some embodiments, HMCs (such as a heat sink) may extend over the IC package substrate above the IC connector. In such embodiments, the downward force exerted by the weight of the heat sink may help engage the signal connections between the cable of the IC connector and the IC package substrate in a similar manner as the socket and the IC package substrate.

In some embodiments, approximately 15 grams of force may be desirable to maintain coupling with bump-on-flex contacts. A connector positioned at the bottom surface of an IC package substrate may be in the same load loop as the socket, which reduces the risk of compromising the signal coupling with an undesired induced moment.

FIG. 5 depicts a schematic cross-sectional view of an IC connector 502 mated with a socket 414 in an IC assembly 500. In FIG. 5, various components of the IC assembly 400 may be similar to those in the IC assembly 400, and thus any suitable embodiment discussed above with reference to the IC assembly 400 may similarly apply to the IC assembly 500. In particular, the IC connector 502 may have a top surface 504, a bottom surface 506, a first side surface 508, a second side surface 510, and a mechanical mating feature 512 proximate to the first side surface 508. The mechanical mating feature 412 may be complementary to a mechanical mating feature 416 proximate to a side surface 418 of the socket 414, and the IC connector 502 may be disposed adjacent to the side surface 418 of the socket 414 when the IC connector 502 and the socket 414 are mated. However, in contrast to the IC connector 402 of FIG. 4, the IC connector 502 may not include signal pathways for routing signals between the IC package substrate 102 and a cable 420. Instead, the IC connector 502 may include a cable receptacle 550 that is disposed on the top surface 504 and is configured to receive the cable 420. In use, the cable 420 may be disposed between the IC connector 502 and the IC package substrate 102, and the IC connector 502 may include one or more spring elements 532 that mechanically couple the signal contacts 422 on the cable 420 directly to the signal contacts 108 on the IC package substrate 102.

Figure 6:
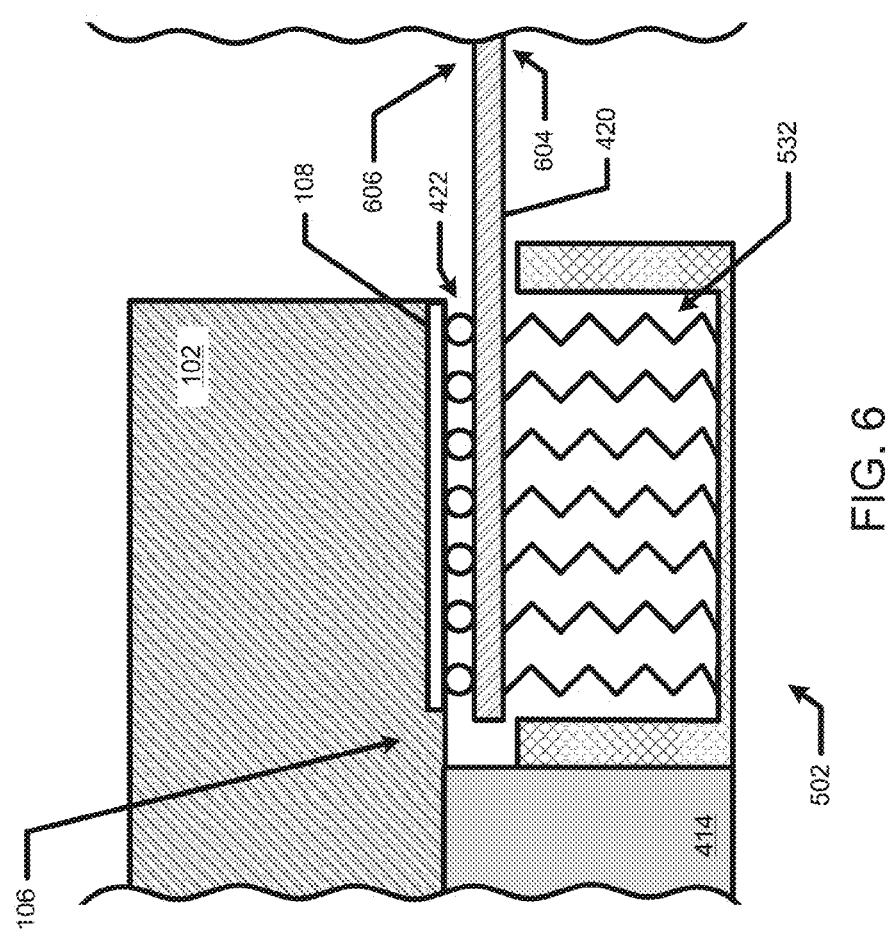
FIG. 6 is a schematic cross-sectional view of an IC connector without signal carriers, in accordance with various embodiments.

An example of the IC connector 502 is depicted in FIG. 6. In FIG. 6, the spring elements 532 may include coil springs, cantilever springs, or any other suitable mechanical component. The spring elements 532 may, when in use, press a bottom surface 604 of the cable 420 toward the IC package substrate 102. When the cable 420 includes signal contacts 422 on the top surface 606 above the IC connector 502, the signal contacts 422 may be pressed toward and coupled with complementary signal contacts 108 on a bottom surface 106 of the IC package substrate 102. In particular, when the IC package substrate 102 is seated in the socket 414 and the IC connector 502 and the socket 414 are mated, the spring elements 532 press the cable 420 against the IC package substrate 102.

Since the electrical pathway between the signal contacts 108 on the bottom surface 106 of the IC package substrate 102 and the signal contacts 422 on the cable 420 is shorter in the embodiment of FIG. 5 than the embodiment of FIG. 4 (in which signals from the IC package substrate 102 are routed through the signal carriers 432 of the IC connector 402), the connector interface of the embodiment of FIG. 5 may be less lossy and less susceptible to interference ("cross-talk") than the embodiment of FIG. 4. These performance benefits may be especially important in HPC applications. In some embodiments, the signal contacts 422 on the cable 420 may take the form of bump-on-flex contacts. Bump-on-flex contacts may have a lower likelihood of contact damage relative to cantilever-type contacts (such as LGA contacts).

In some embodiments of the IC connector 502 of FIG. 5, the mechanical coupling between the cable 420 and the IC package substrate 102 may be substantially independent from the signal coupling between the same elements. This may be advantageous in some applications. Existing technologies typically use a single element for both mechanical and signal coupling. Because mechanical coupling elements may introduce increased signal resistance into a contact, and because materials with good signal coupling properties may have undesired structural properties, both the mechanical and signal performance of these existing technologies may be limited. Embodiments of the IC connectors disclosed herein (e.g., those described above with reference to FIGS. 5 and 6) may allow the mechanical and signal elements to be selected for desired performance of their particular function largely independently, which may improve signal coupling and/or mechanical coupling performance.

In the embodiments of FIGS. 4 and 5, the IC connectors 402 and 502, respectively, are not mounted to the IC package substrate 102, but are instead mechanically coupled with the socket 414 and may be readily disengaged and replaced. This construction may be advantageous over constructions in which an IC connector is surface mounted to the bottom surface of the IC package substrate 102. In particular, if such a mounted connector fails, the entire IC package substrate 102 must be carefully fixed or replaced. Since the IC package substrate 102 is typically among the most delicate and costly components, this servicing may be expensive, time-consuming, and decrease the reliability of the IC device in which the IC assembly is included. In contrast, if the IC connectors of FIGS. 4 and 5 fail, the IC connectors may be replaced by pulling the IC package substrate 102 from the socket 414, snapping out the failed connector, snapping in a new connector, and remounting the IC package substrate 102 in the socket 414. Moreover, the signal connections between the IC package substrate 102 and the cable 420 of the IC connectors 402 and 502 may be made using the same vertical insertion process required for seating the IC package substrate 102 in the socket 414, and therefore no additional manufacturing steps (e.g., surface mounting an IC connector to the IC package substrate 102 or the circuit board 142) may be required. This may make the IC connectors disclosed herein (e.g., the IC connectors 402 and 502) "transparent" to the OEM, and thus may enable additional signal capacity without requiring changes in OEM assembly processes.

Figure 7:
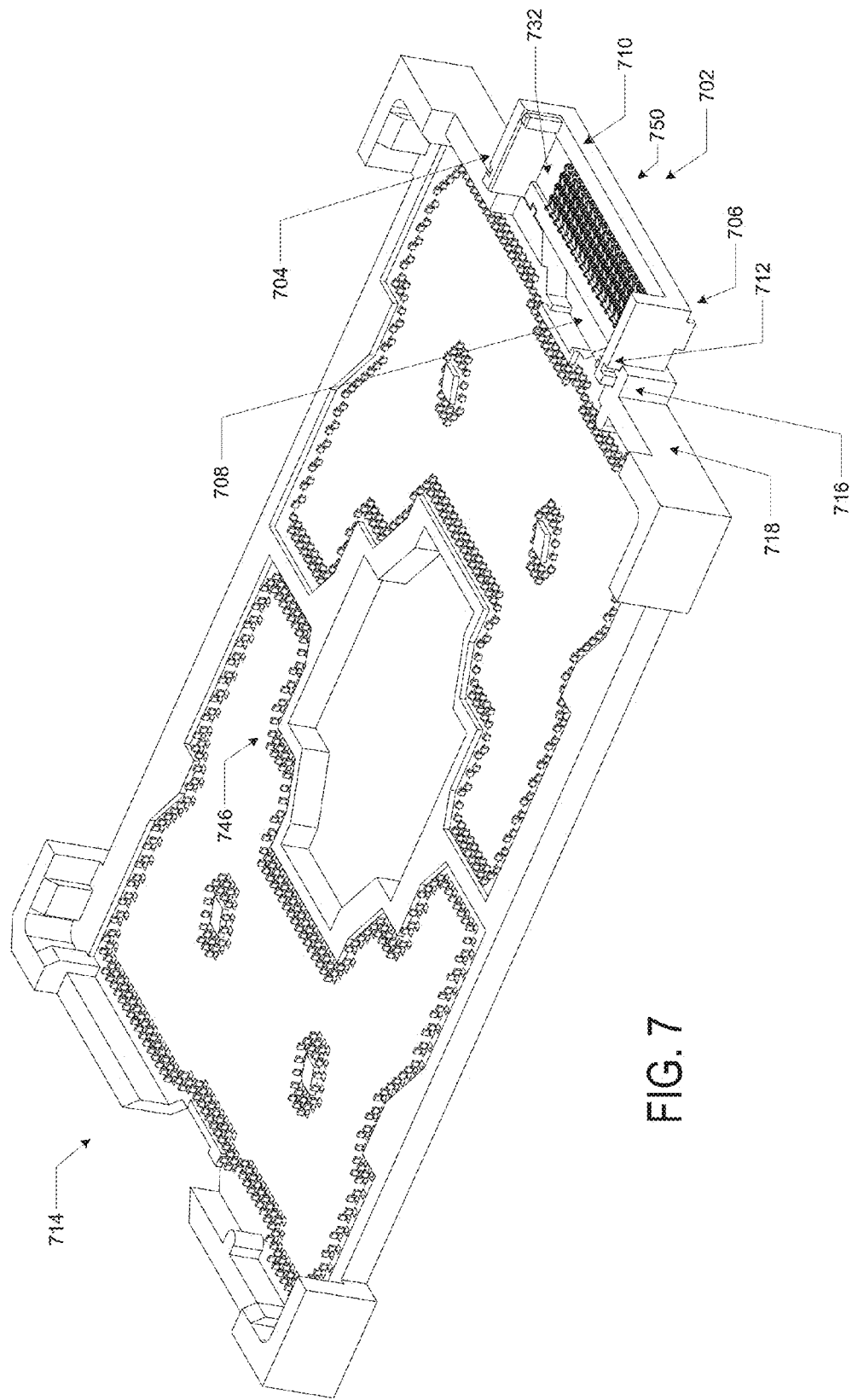
FIG. 7 is a perspective view of an IC connector mated with a socket, in accordance with various embodiments.

FIG. 7 is a perspective view of an IC connector 702 mated with a socket 714, in accordance with various embodiments. The IC connector 702 may serve as the IC connector 402 of FIG. 4. The socket 714 may serve as the socket 414 of FIGS. 4 and 5. The socket 714 may include signal contacts 746, which may couple with signal contacts of the IC package substrate 102 (not shown) when the IC package substrate 102 is seated in the socket 414. The socket 414 may route signals (not shown) from the IC package substrate 102 through the signal contacts 746 and to the circuit board 142 (not shown) in any conventional manner.

The IC connector 702 may include a top surface 704, a bottom surface 706, a first side surface 708 and a second side surface 710. As shown in FIG. 7, the second side surface 710 may be disposed opposite to the first side surface 708. The IC connector 702 may also include a mechanical mating feature 712 proximate to the first side surface 708. The mechanical mating feature 712 may be complementary to a mechanical mating feature 716 proximate to a side surface 718 of the socket 714. As shown in FIG. 7, when the IC connector 702 and the socket 714 are mated, the IC connector 702 is disposed adjacent to the side surface 718 of the socket 714.

The IC connector 702 may also include a cable receptacle 750 to receive a cable (not shown). In FIG. 7, the cable receptacle 750 is disposed on the bottom surface 706 of the IC connector 702 (e.g., as discussed above with reference to FIG. 4), but it may be disposed on the top surface 704 (e.g., as discussed above with reference to FIG. 5). The cable may include signal contacts coupled with signal carriers, and when the cable is disposed in the cable receptacle 750, the signal carriers extend beyond an edge defined by the second side surface 710. The signal contacts of the cable may be coupled with signal contacts on a bottom surface of the IC package substrate 102 (not shown) when the IC package substrate 102 is seated in the socket 714, the IC connector 702 and the socket 714 are mated, and the cable is disposed in the cable receptacle 750 (e.g., as discussed above with reference to FIGS. 4 and 5).

Also included in the IC connector 702 are signal carriers 732. When the IC package substrate 102 is seated in the socket 714, the signal carriers 732 may be disposed between the signal contacts of the cable and the signal contacts on the bottom surface of the IC package substrate 102 (e.g., as discussed above with reference to FIG. 4). In some embodiments, the IC connector 702 does not include the signal carriers 732 and instead includes one or more spring elements for coupling signal contacts on the cable to signal contacts on a bottom surface 106 of the IC package substrate 102 (e.g., as discussed above with reference to FIG. 5). For example, the IC connector 702 may include the spring elements 532 of FIGS. 5 and 6 instead of the signal carriers 732. In embodiments in which the IC connector 702 includes spring elements instead of or in addition to signal carriers, other aspects of the IC connector 702 may remain the same (e.g., the mechanical mating feature 712 and other geometric aspects). Thus, the discussion of the IC connector 702 and the socket 714 below apply, as suitable, to embodiments in which the IC connector 702 includes spring elements instead of or in addition to the signal carriers 732.

Figure 8:
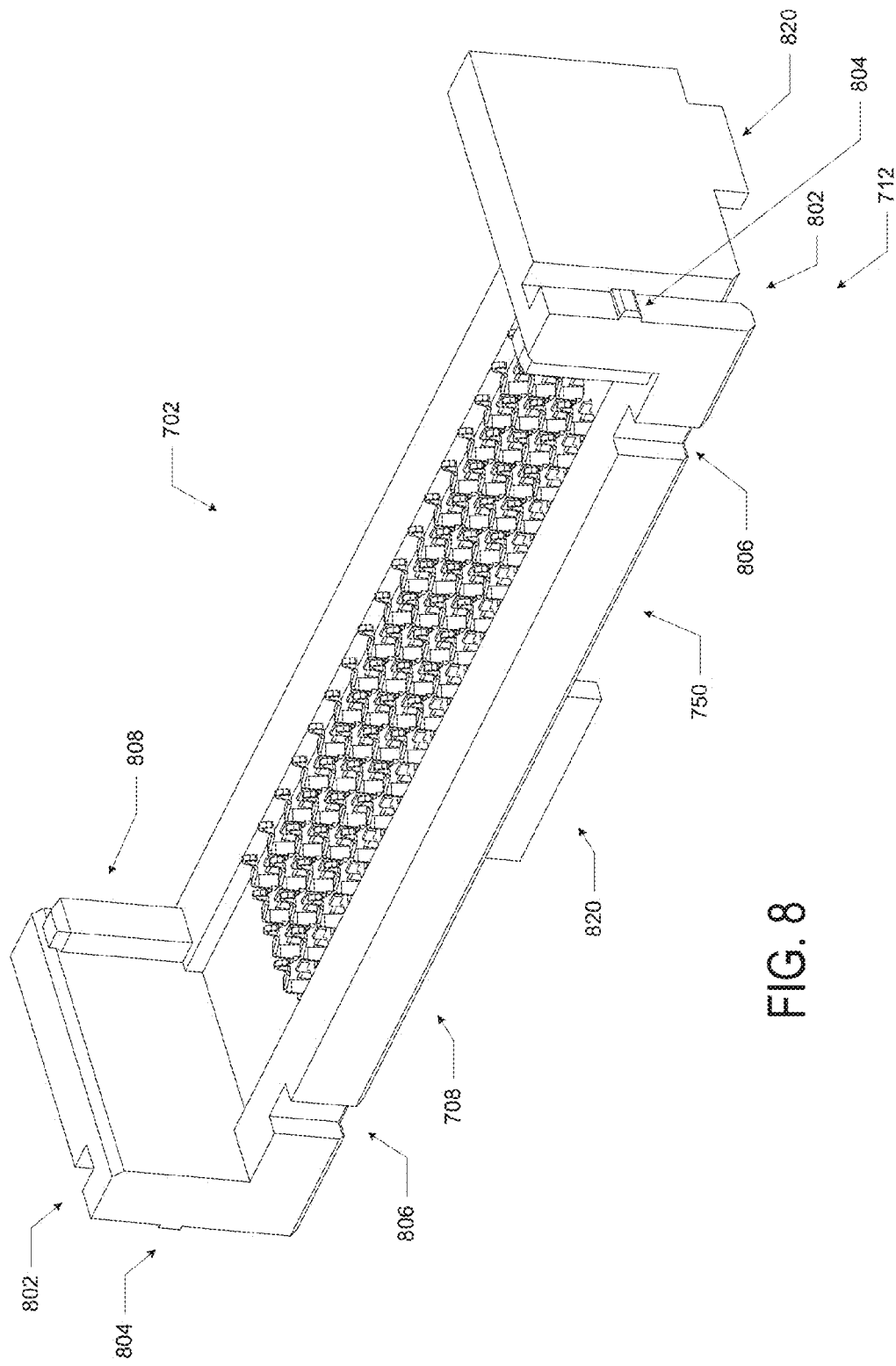
FIGS. 8-10 are various views of the IC connector of FIG. 7, in accordance with various embodiments.
Figure 9:
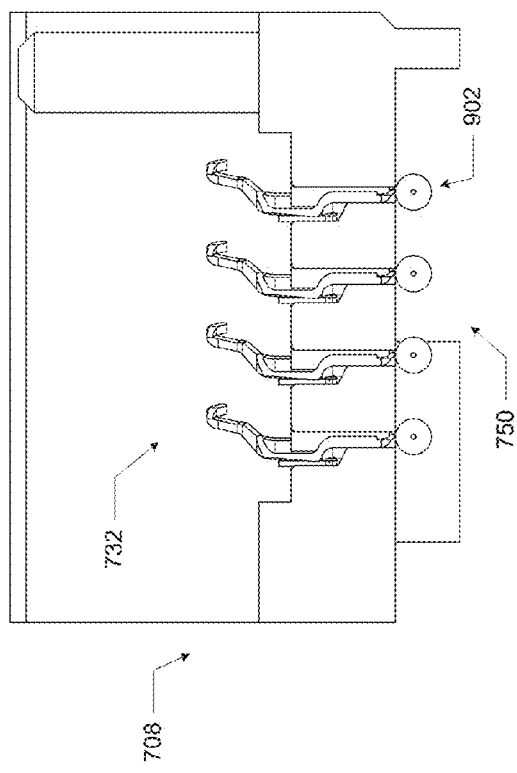
Figure 10:
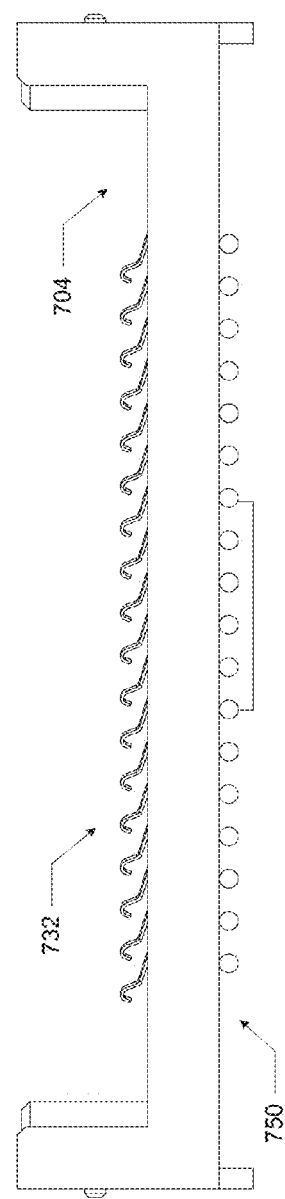

FIGS. 8-10 are various views of portions of the IC connector 702 of FIG. 7. FIG. 8 is a perspective view of the IC connector 702, including the cable receptacle 750 and the mechanical mating feature 712 proximate to the first side surface 708. As shown in FIG. 8, the mechanical mating feature 712 may include one or more grooves (such as the grooves 802), protrusions (such as the protrusions 804), notches (such as the notch 806) or other keyed elements to improve alignment between the socket 714 and the IC connector 702 and secure the fit when the socket 714 and the IC connector 702 are mated. The complementary mechanical mating feature 716 on the socket 714 may include complementary keyed elements (e.g., as discussed below with reference to FIG. 11). The IC connector 702 may further include registration elements for aligning the IC package substrate 102 (not shown) with the IC connector 702. For example, the ridges 808 may align with complementary features in the IC package substrate 102 (e.g., in the diving board 140) to ensure proper alignment between the IC connector 702 and the IC package substrate 102 during assembly.

The IC connector 702 may further include one or more standoffs 820, which may contact the circuit board 142 when the IC connector 702 is mated to the socket 714. The standoffs 820 may help prevent bending and solder joint failures. In particular, because the IC connector 702 may be constrained in a vertical direction and there may be some clearance between the IC connector 702 and the circuit board 142 (e.g., a few hundred microns of clearance), a load applied to the top surface 704 may cause the IC connector 702 to bend. Warpage in the IC package substrate 102 and/or the socket 714 may contribute to or cause such bending. The tensile stresses incurred in the solder joints of the IC connector 702 due to this bending may result in their failure. In some embodiments, the standoffs 820 may reduce the clearance between the IC connector 702 and the circuit board 142 such that if the IC connector 702 begins to bend, the standoffs 820 may touch the circuit board 142 before excessive bending occurs, which may transmit the load to the circuit board 142 and thereby mitigate the bending and solder joint failure. For a particular application, the dimensions and final shapes of the mechanical mating features, registration elements, standoffs and other elements of the IC connector 702 may be determined based on known finite element and tolerance analysis techniques.

FIG. 9 is a side cross-sectional view of the IC connector 702 of FIG. 7. As shown in FIG. 9, the signal carriers 732 may include one or more LGA contacts disposed substantially parallel to the first side surface 708. The signal carriers 732 may have solder balls 902 disposed at one end; these solder balls may be positioned to mechanically contact the signal contacts of a cable disposed in the cable receptacle 750.

FIG. 10 is a cross-sectional view of the IC connector 702 from the first side surface 708. The cantilevers of the LGA signal carriers 732 can be seen extending away from the top surface 704 of the IC connector 702, while the other ends of the signal carriers 732 extend into the cable receptacle 750 to make contact with the signal contacts on a cable (not shown). In alternate embodiments, the signal carriers 732 may be vertical contacts instead of or in addition to LGA contacts. In alternate embodiments, the signal carriers 732 may be replaced with spring elements (such as the spring elements 532 of FIG. 5). In such embodiments, the cable receptacle may be located above the top surface 704 so that the cable may be disposed between the spring elements and the IC package substrate 102 (not shown).

Figure 11:
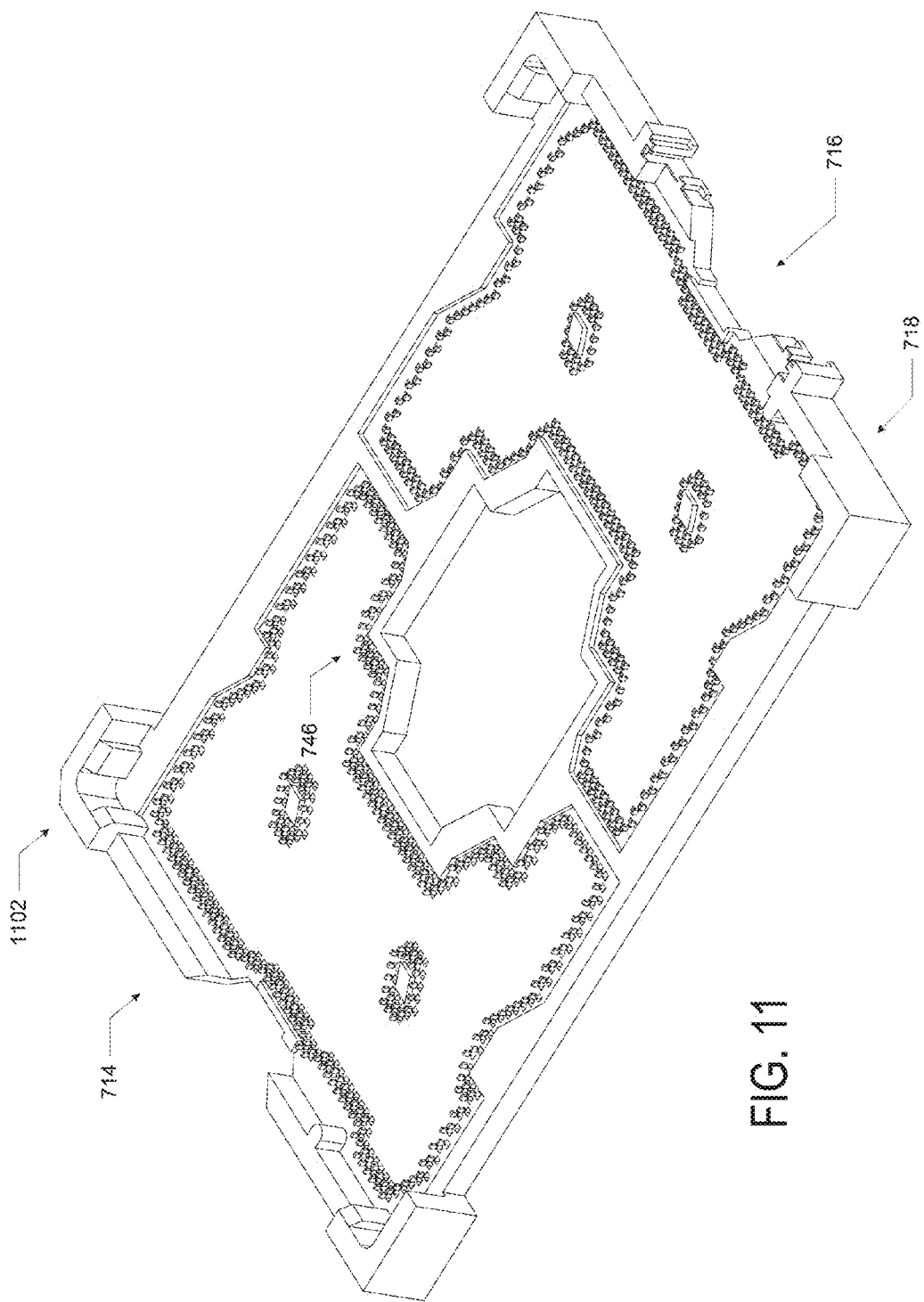
FIG. 11 is a perspective view of the socket of FIG. 7, in accordance with various embodiments.

FIG. 11 is a perspective view of the socket 714 of FIG. 7. As noted above, the socket 714 may include signal contacts 746, which may couple with signal contacts of the IC package substrate 102 (not shown) when the IC package substrate 102 is seated in the socket 414. The socket 414 may route signals (not shown) from the IC package substrate 102 through the signal contacts 746 and to the circuit board 142 (not shown) in any conventional manner. The mechanical mating feature 716 in the side surface 718 may be complementary to the mechanical mating feature 712 of the IC connector 702. In particular, the mechanical mating feature 716 of the socket 714 may include one or more grooves, notches or other keyed elements to improve alignment between the socket 714 and the IC connector 702 and secure the fit between the socket 714 and the IC connector 702 when mated. The socket 714 may further include elements for aligning the IC package substrate 102 (not shown) with the socket 714. For example, the walls 1102 may align with the edges of the IC package substrate 102 to ensure proper alignment between the socket 714 and the IC package substrate 102 during assembly.

FIG. 12 is a perspective view of a bump-on-flex cable 1202, which may serve as any of the cables discussed herein (e.g., the cable 420). The cable 1202 may include a number of signal contacts 1204, which may be arranged at a first end 1206 of the cable 1202. As discussed above, the signal contacts 1204 may be formed as "bumps" on a surface of a flexible film, and may be coupled with signal carriers (not shown) that are printed on or in the film and that run from the signal contacts 1204 at the first end 1206 of the cable 1202 to the second portion 1208 of the cable 1202 (referred to as "flex signal carriers"). In some embodiments, the cable 1202 may widen in a fan-out portion 1210 in a direction away from the first end 1206. The distance between the flex signal carriers may increase in this fan-out portion (e.g., from approximately 0.6 millimeters at the first end 1206 to approximately 1 millimeter in the second portion 1208). The dimensions of the fan-out portion 1210 may be selected as desired for various applications (based on, for example, the distance between components to be connected by the cable 1202 and constraints on the width of the cable 1202 imposed by other components mounted to the circuit board 142).

In some embodiments, the flex signal carriers may be coupled with coaxial signal carriers 1212 at the second portion 1208 of the cable 1202. Each of the coaxial signal carriers 1212 may include a coaxial cable (e.g., a microcoaxial cable). The coaxial signal carriers 1212 may have any desired length (based on, for example, the distance between components to be connected by the cable 1202. In some embodiments, a cable 1202 that includes a flex portion and a coaxial portion may be particularly advantageous. A flex portion (which may have a smaller height than a coaxial cable) may be used to fit into the small gap (e.g., less than one millimeter) between the IC connector and the circuit board. A coaxial cable, which typically requires two or more millimeters of space to accommodate an attachment point, may not be able to fit into this gap, especially when multiple coaxial cables may need to be stacked in order to accommodate a multi-row arrangement of signal contacts in an IC connector. However, since flex cables are typically lossier than coaxial cables, a coaxial portion may attach to the flex portion at a point away from the IC connector, which may reduce the lossiness of the cable 1202 relative to a cable formed entirely from flex cable.

In various embodiments, the first end 1206 of the cable 1202 may be disposed adjacent to an IC connector in order to couple the signal contacts 1204 to corresponding signal contacts 110 on the bottom surface 106 of the IC package substrate 102. In embodiments in which the IC connector includes signal carriers (e.g., the embodiments discussed above with reference to FIG. 4, the cable 1202 may be positioned adjacent to a bottom surface of the IC connector and the signal contacts 1204 of the cable 1202 may face the signal carriers of the IC connector so that the signal carriers of the IC connector may couple the signal contacts 1204 with the corresponding signal contacts 110 of the IC package substrate 102. In embodiments in which the IC connector includes spring elements instead of or in addition to signal carriers (e.g., the embodiments discussed above with reference to FIG. 5), the cable 1202 may be positioned adjacent to a top surface of the IC connector and the signal contacts 1204 of the cable 1202 may face away from the IC connector and towards the corresponding signal contacts 110 of the IC package substrate 102 (and may make direct contact with the signal contacts 110).

Figure 13:
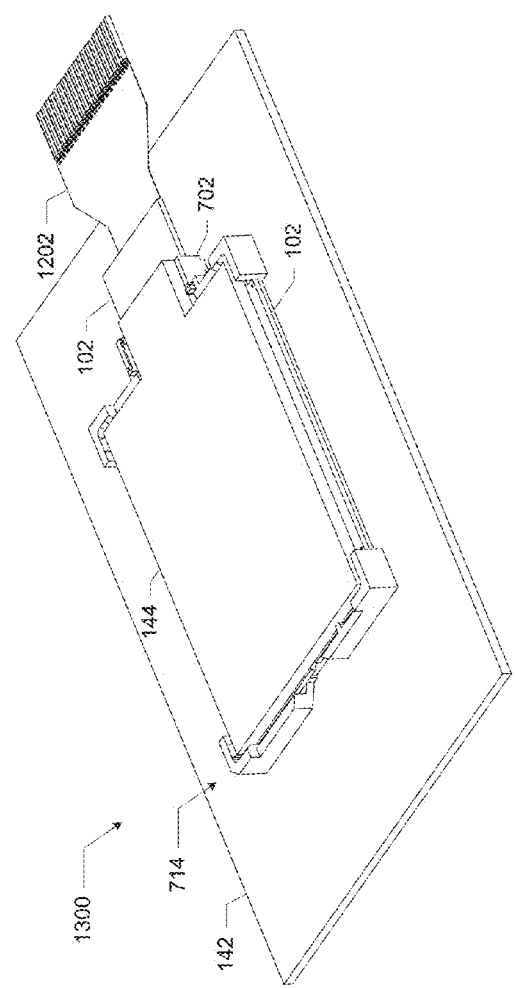
FIG. 13 is a perspective view of an IC assembly having the IC connector and socket of FIG. 7 and the bump-on-flex cable of FIG. 12, in accordance with various embodiments.

FIG. 13 is a perspective view of an IC assembly 1300 having the IC connector 702 and the socket 714 of FIG. 7 and the bump-on-flex cable 1202 of FIG. 12. In the IC assembly 1300, the IC connector 702 is mated with the socket 714. The cable 1202 is disposed on the bottom surface 706 of the IC connector 702 between the IC connector 702 and the circuit board 142. The IC package substrate 102 is seated in the socket 714 and a diving board 140 of the IC package substrate extends over the IC connector 702. An HMC 144 is disposed on top of the IC package substrate 102, and also extends over the IC connector 702. In the IC assembly 1300, the signal contacts 110 (hidden) on the bottom surface 106 of the IC package substrate 102 may be coupled with the signal contacts 746 (hidden) of the socket 714 for routing signals from the signal contacts 110 through the socket 714 and into the circuit board 142. Other signal contacts 108 (hidden) on the bottom surface 106 of the IC package substrate 102 may be coupled with the signal contacts 1204 (hidden) of the cable 1202 via the signal carriers 732 (hidden) in the IC connector 702. Thus, signals from the IC package substrate 102 may be routed to the cable 1202 and thereupon to other devices without having to go into the circuit board 142.

In alternate embodiments, the signal carriers 732 of the IC connector 702 in the IC assembly 1300 are replaced or augmented with spring elements (e.g., the spring elements 532 of FIG. 5) to form the IC connector 502 (FIG. 5). In such embodiments, the cable 1202 may be disposed in the cable receptacle 550 on the top surface 504 of the IC connector 502, and the signal contacts 1204 of the cable 1202 may be in direct contact with the signal contacts 108 on the bottom surface 106 of the IC package substrate 102.

Figure 14:
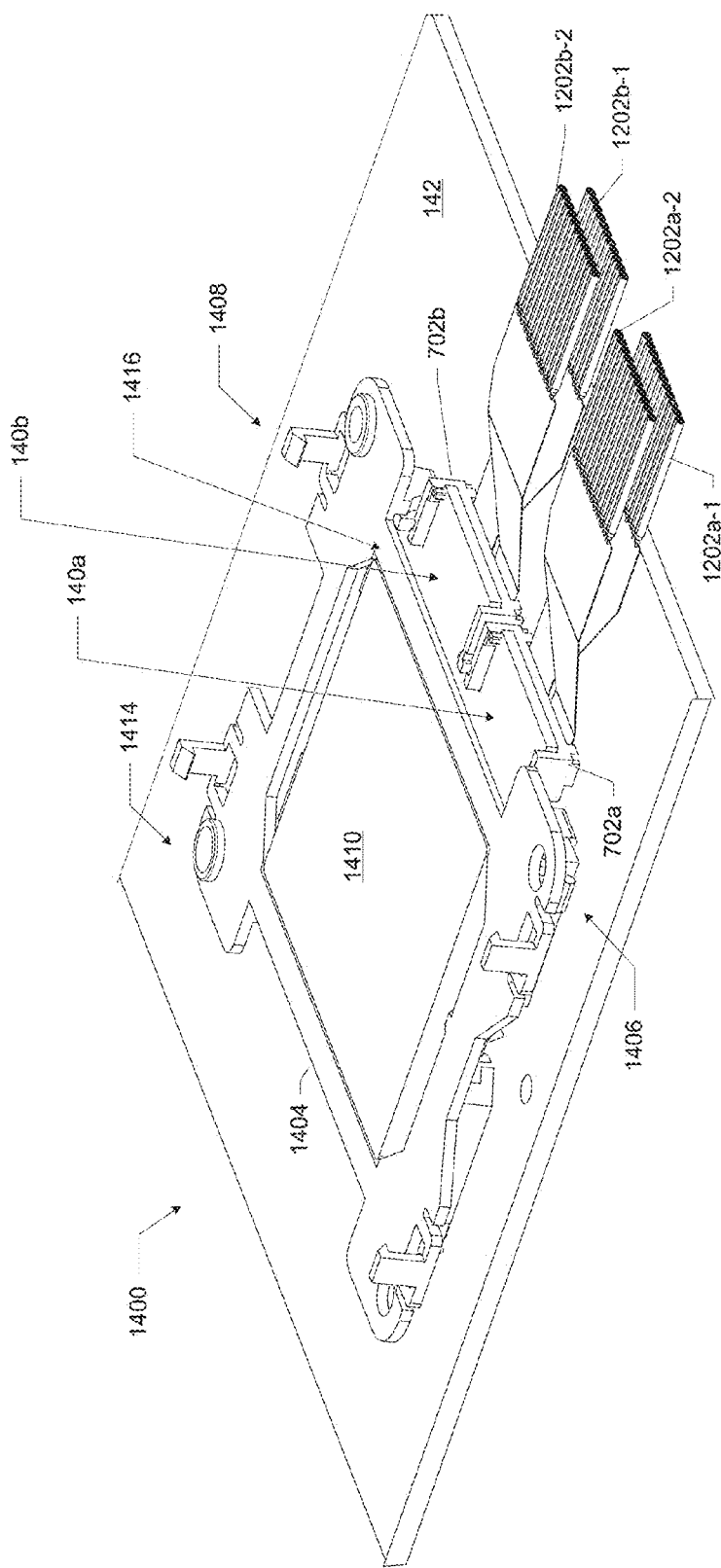
FIG. 14 is a perspective view of an IC assembly having a cradle, in accordance with various embodiments.

FIG. 14 is a perspective view of an IC assembly 1400 having a cradle 1404. The IC assembly 1400 is depicted as seated on a circuit board 142 over a socket (not shown). The cradle 1404 may be formed from a plastic material, and may include a first set of clips 1406 into which the IC package substrate 102 may be disposed to retain the IC package substrate in the cradle 1404. A bottom surface of a first portion 1416 of the cradle 1404 may be in contact with a top side of the IC package substrate 102 in the IC assembly 1400.

In some embodiments, the IC package substrate 102 may include two diving boards, each of which may extend over an IC connector; in FIG. 13, the two diving boards 140a and 140b extend over IC connectors 702a and 702b, respectively. Each of the diving boards 140a and 140b may include signal contacts on the bottom surface, facing the respective IC connectors 702a and 702b. The IC assembly 1400 may include one socket (e.g., the socket 714, hidden) having two sets of mechanical mating features for mating with the IC connectors 702a and 702b, or the IC assembly 1400 may include two sockets each having one set of mechanical mating features for mating with respective ones of the IC connectors 702a and 702b. Multiple diving boards may provide multiple points at which signals can be transmitted to and/or from the IC package substrate 102. For example, each of the diving boards 140a and 140b may include 168 signal contacts, which may be routed through the IC connectors 702a and 702b respectively.

In some embodiments, two or more cables may be received in a cable receptacle of an IC connector. For example, as shown in FIG. 14, two cables 1202a-1 and 1202a-2 may be associated with the IC connector 702a and two cables 1202b-1 and 1202b-2 may be associated with the IC connector 702b. Each of the cables 1202a-1 and 1202a-2 may route a portion of the signals from the diving board 140a; for example, if the diving board 140a includes 168 signal contacts, each of the cables 1202a-1 and 1202a-2 may include 84 signal carriers. The diving board 140b and the cables 1202b-1 and 1202b-2 may be configured analogously.

Each pair of cables may be arranged so that one cable is positioned above the other cable. In particular, the cable 1202a-2 is disposed adjacent to the cable 1202a-2 at a position proximate to the IC connector 702a, and widens in a direction away from the IC connector 702a, extending above the cable 1202a-2 at a position distal from the IC connector 702a. Analogously, the cable 1202b-2 is disposed adjacent to the cable 1202b-2 at a position proximate to the IC connector 702b, and widens in a direction away from the IC connector 702b, extending above the cable 1202b-2 at a position distal from the IC connector 702b. Stacking the cables in this manner may save space on the circuit board 142, and may avoid the losses imposed by using a dongle connector (which may introduce another interface through which losses may be incurred). In some embodiments, directly attaching flex cables to coaxial cables may reduce the losses associated with using an additional dongle connector.

Figure 15:
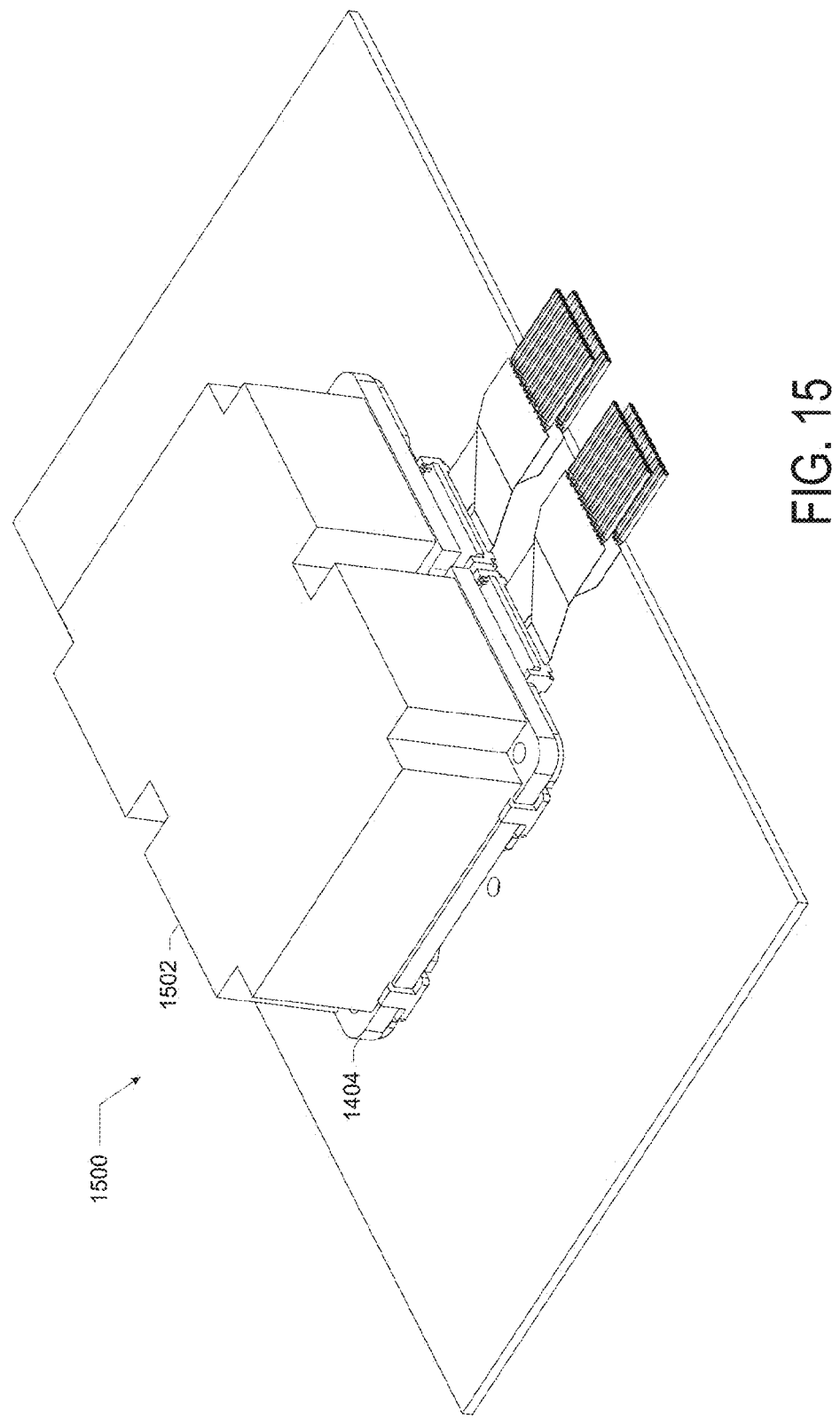
FIG. 15 is a perspective view of the IC assembly of FIG. 14 having a heat sink seated in the cradle, in accordance with various embodiments.

An IHS 1410 is shown disposed above the IC package substrate 102. The cradle 1404 may also into a second set of clips 1408 which may secure a heat sink or any other additional elements to the IHS 1410. FIG. 15 is a perspective view of an IC assembly 1500 having a heat sink 1502 seated in the clips 1408 of the cradle 1404.

The cradle may also include one or more registration elements 1414, which may help the cradle 1404 (and its associated components) align with complementary features on the circuit board 142. For example, in some embodiments, a bolster plate may be mounted to the circuit board 142, and may have one or more posts that are arranged to be complementary to the registration elements 1414. During assembly, the cradle 1404 may be aligned with the bolster plate such that the posts will extend through the registration elements 1414, thereby aligning the socket (hidden) with the circuit board 142. The bolster plate may include a spring that pushes against the cradle 1404, and a lever that compresses the spring and clamps the cradle 1404 to the bolster plate to secure the cradle 1404 in place.

Figure 16:
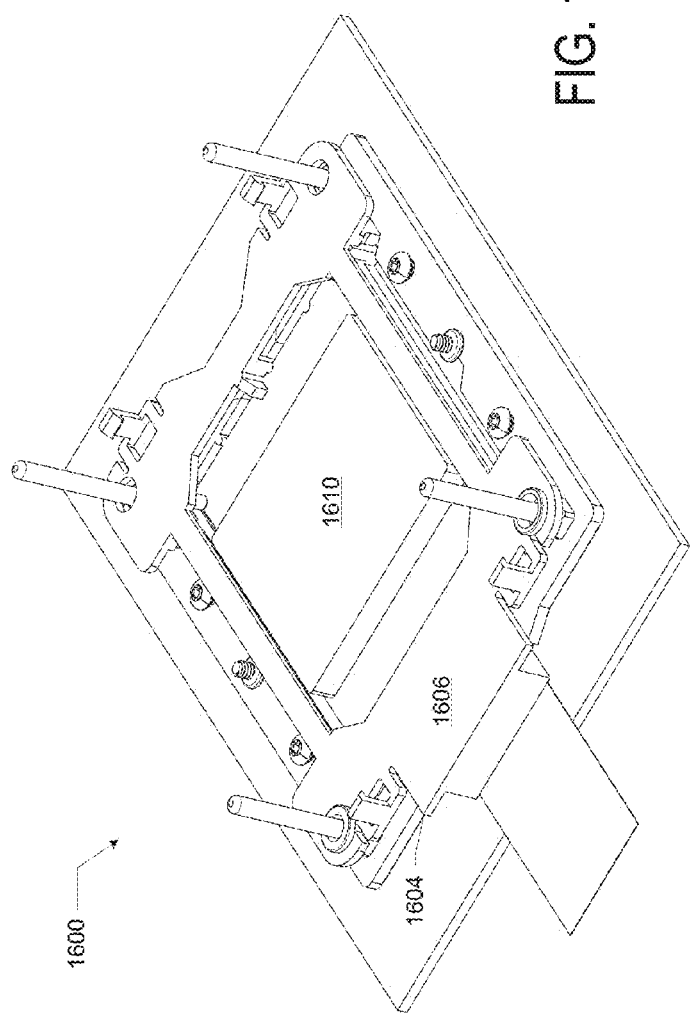
FIG. 16 is a perspective view of another IC assembly having a cradle, in accordance with various embodiments.

FIG. 16 depicts an IC assembly 1600 including a cradle 1604. The cradle 1604 may be formed from a plastic material, and may have many of the features discussed above with reference to the cradle 1404 of FIG. 14 (e.g., registration elements, clips, etc.). Unlike the cradle 1404, the cradle 1604 includes an extension portion 1606 which, when the cradle 1604 is positioned over a socket mated with an IC connector (e.g., the IC connector 702 of FIG. 7, hidden), a bottom surface of the extension portion 1606 is in contact with a top surface 104 of the IC package substrate 102. An IHS 1610 is shown as disposed within the cradle 1604; when a heat sink is coupled to the top of the IHS 1610, the heat sink may be dimensioned to extend above the extension portion 1606 and thereby apply pressure to the top surface of the extension portion 1606. This pressure may be transmitted through the extension portion 1606 onto the top surface 104 of the IC package substrate 102 (e.g., the diving board 140), which in turn may press the signal contacts 108 on the bottom surface 106 of the IC package substrate 102 into the signal carriers of the IC connector (e.g., the signal carriers 432 of the IC connector 402 of FIG. 4) or the signal contacts of a cable (e.g., the signal contacts 422 of the cable 420). Thus, a cradle having an extension portion like the extension portion 1606 may advantageously allow the weight of the heat sink to help ensure sufficient signal coupling between the IC package substrate 102 and the cable 420 in embodiments in which the IHS does not extend above the IC connector. The extension portion 1606 may also be used to secure the cable 420 at a desired location (e.g., by "trapping" the cable 420 against the circuit board 142 near the IC connector) in order to provide strain relief.

Figure 17:
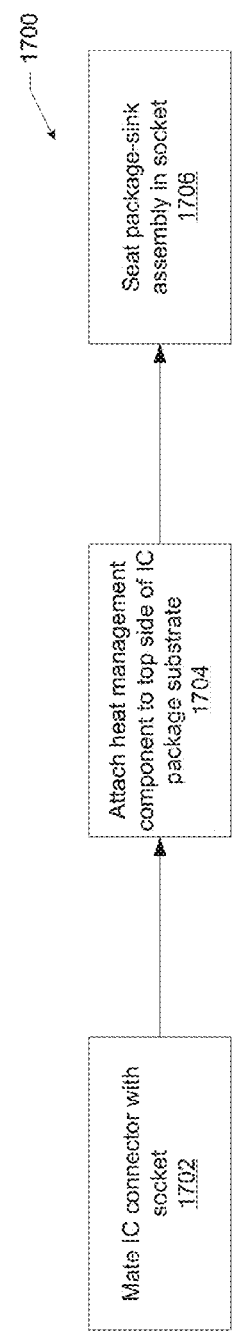
FIG. 17 is a flow diagram illustrating a process for assembling an IC assembly, in accordance with various embodiments.

FIG. 17 is a flow diagram illustrating a process 1700 for assembling an IC assembly (e.g., the IC assemblies 400 and 500 of FIGS. 4 and 5), in accordance with some embodiments. The operations of the process 1700, although illustrated as performed in a particular sequence for the sake of illustration, may be performed in parallel as suitable. Any of the operations of the process 1700 may be performed in accordance with any suitable embodiments of the IC assemblies described herein.

The process 1700 may begin at the operation 1702, in which an IC connector may be mated with a socket. The socket may have been previously mounted to a circuit board (e.g., as shown in FIGS. 4 and 5). The IC connector may take the form of any of the IC connectors discussed above with reference to FIGS. 4 and 5 (e.g., the IC connector 702 of FIG. 7). The socket may take the form of any of the sockets discussed above with reference to FIGS. 4 and 5 (e.g., the socket 714 of FIG. 7). Upon mating at the operation 1702, the IC connector may be disposed adjacent to a side surface of the socket. The socket may have signal contacts (e.g., the signal contacts 746 of FIG. 7). A cable (e.g., the cable 420) may be coupled to the IC connector at the operation 1702. In various embodiments, the cable may be disposed above or below the IC connector (e.g., as discussed above with reference to FIGS. 4 and 5).

At the operation 1704, an HMC (e.g., the HMC 144) may be attached to a top side of an IC package substrate to form a package-HMC assembly. In some embodiments, the HMC attached at the operation 1702 may include a heat sink. A bottom surface of the IC package substrate may have first and second signal contacts. For example, the IC package substrate 102 may include the first signal contacts 110 and the second signal contacts 108 on the bottom surface 106. In some embodiments, the package-HMC assembly may include a cradle in which the IC package substrate is disposed (e.g., the cradle 1404 of FIG. 14). The cradle may clamp the IC package substrate and the HMC together. In some such embodiments, a bottom surface of a first portion of the cradle may be in contact with a top side of the IC package substrate when the package-sink assembly is seated in the socket and the IC connector and the socket are mated (e.g., as discussed above with reference to the cradle 1404 of FIG. 14). In some embodiments, the operations 1702 and 1704 may be performed in parallel, with the IC connector mated with the socket while the HMC is attached to a top side of the IC package substrate.

At the operation 1706, the package-HMC assembly may be seated in the socket. The package-HMC assembly may be seated so that the first signal contacts of the IC package substrate are coupled with the signal contacts of the socket (and thereby routed to the circuit board on which the socket is mounted). For example, the signal contacts 110 of the IC package substrate 102 may be coupled with the signal contacts 446 of the socket 414. Also at the operation 1706, the second signal contacts of the IC package substrate may be coupled with signal contacts of a cable adjacent to the IC connector and having signal carriers extending away from the side surface of the socket. For example, the second signal contacts of the IC package substrate may be directly coupled with signal carriers of the IC package connector and thereby coupled to signal contacts of a cable coupled to the signal carriers of the IC package connector. For example, the signal contacts 108 of the IC package substrate 102 may be coupled with the signal carriers 432 of the IC connector 402 and thereby coupled to the signal contacts 422 of the cable 420 (FIG. 4). In another example, the signal contacts 108 of the IC package substrate 102 may be coupled with the signal contacts 422 of the cable 420 when the cable 420 is disposed between the IC package substrate 102 and the IC connector 502 (FIG. 5). The process 1700 may then end.

The following paragraphs provide a number of illustrative embodiments of the present disclosure. Example 1 is an IC assembly, including: an IC package substrate having a top surface, a bottom surface, and a side surface, the IC package substrate having first signal contacts on the top surface or the bottom surface, and the bottom surface having second signal contacts for coupling with a socket on a circuit board; an intermediate member having a first end and a second end, an axis defined between the first and second ends, the first end having signal contacts coupled to the first signal contacts of the IC package substrate, and the second end extending beyond an edge of the IC package substrate defined by the side surface; and a male connector, disposed at the second end of the intermediate member, having signal contacts coupled to the signal contacts of the intermediate member, and mateable with a female connector when the female connector is brought into engagement with the male connector in a direction parallel to the axis.

Example 2 may include the subject matter of Example 1, and may further include: the female connector, having signal contacts to couple to the signal contacts of the male connector when the female and male connectors are engaged; and a cable having signal carriers coupled to the signal contacts of the female connector, the cable extending in a direction parallel to the axis when the female and male connectors are engaged.

Example 3 may include the subject matter of Example 2, and may further specify that the female connector is a low insertion force connector.

Example 4 may include the subject matter of any of Examples 2-3, and may further specify that the cable is a coaxial cable.

Example 5 may include the subject matter of any of Examples 2-4, and may further specify that the cable is a fiber optic cable.

Example 6 may include the subject matter of any of Examples 2-5, and may further specify that the cable is coupled to a switch coupled to multiple processing units.

Example 7 may include the subject matter of any of Examples 1-6, and may further specify that the intermediate member includes a flexible flat cable.

Example 8 may include the subject matter of any of Examples 1-7, and may further specify that the intermediate member includes a rigid circuit board.

Example 9 may include the subject matter of Example 8, and may further specify that the male connector includes an extension portion of the rigid circuit board, the extension portion extending away from a body of the rigid circuit board in a direction of the axis.

Example 10 may include the subject matter of any of Examples 1-9, and may further specify that the circuit board is a motherboard.

Example 11 is an IC connector, including: a top surface; a bottom surface; first and second side surfaces; a mechanical mating feature proximate to the first side surface, complementary to a mechanical mating feature proximate to a side surface of a socket for an IC package substrate, wherein the IC connector is disposed adjacent to the side surface of the socket when the IC connector and the socket are mated; and a cable receptacle disposed on the top surface or the bottom surface, to receive a cable including signal contacts coupled with signal carriers, wherein the signal carriers extend beyond an edge defined by the second side surface and the signal contacts are coupled with signal contacts on a bottom surface of the IC package substrate when the IC package substrate is seated in the socket, the IC connector and the socket are mated, and the cable is disposed in the cable receptacle.

Example 12 may include the subject matter of Example 11, and may further specify that the second side surface is disposed opposite to the first side surface.

Example 13 may include the subject matter of any of Examples 11-12, and may further specify that the signal carriers of the cable are first signal carriers, and that the IC connector further includes second signal carriers, each disposed substantially parallel to the first side surface, wherein the second signal carriers are disposed between the signal contacts of the cable and the signal contacts on the bottom surface of the IC package substrate when the IC package substrate is seated in the socket and the cable is disposed in the cable receptacle.

Example 14 may include the subject matter of Example 13, and may further specify that the second signal carriers include a land grid array connector.

Example 15 may include the subject matter of any of Examples 13-14, and may further specify that the second signal carriers include a vertical contact.

Example 16 may include the subject matter of any of Examples 11-15, and may further specify that the signal contacts of the cable include bump-on-flex contacts.

Example 17 may include the subject matter of any of Examples 11-16, and may further specify that the cable receptacle is disposed on the top surface and that the IC connector further includes one or more springs, disposed below the cable receptacle, wherein the one or more springs press the cable against the IC package substrate when the IC package substrate is seated in the socket, the IC connector and the socket are mated, and the cable is disposed in the cable receptacle.

Example 18 may include the subject matter of any of Examples 11-17, and may further include the cable.

Example 19 may include the subject matter of Example 18, and may further specify that the cable is a first cable, and the IC connector further includes a second cable that is disposed adjacent to the first cable at a position proximate to the second side surface, the second cable widening in a direction away from the second surface and extending above the first cable at a position distal from the second side surface.

Example 20 may include the subject matter of any of Examples 11-19, and may further specify that the IC connector is disposed below a diving board structure of the IC package substrate when the IC package substrate is seated in the socket and the IC connector and the socket are mated.

Example 21 is a method of assembling an integrated circuit (IC) assembly, including: mating an IC connector with a socket, the IC connector disposed adjacent to a side surface of the socket when the IC connector and the socket are mated, the socket having signal contacts; attaching a heat management component (HMC) to a top side of an IC package substrate to form a package-HMC assembly, a bottom surface of the IC package substrate having first and second signal contacts; and seating the package-HMC assembly in the socket so that the first signal contacts of the IC package substrate are coupled with the signal contacts of the socket and the second signal contacts of the IC package substrate are coupled with signal contacts of a cable adjacent to the IC connector and having signal carriers extending away from the side surface of the socket.

Example 22 may include the subject matter of Example 21, and may further specify that the second signal contacts of the IC package substrate are coupled with signal contacts of a cable disposed between the IC package substrate and the IC package connector, and wherein the cable has signal contacts coupled with signal carriers extending away from the IC connector.

Example 23 may include the subject matter of any of Examples 21-22, and may further specify that the package-HMC assembly includes a cradle in which the IC package substrate is disposed.

Example 24 may include the subject matter of Example 23, and may further specify that a bottom surface of a first portion of the cradle is in contact with a top side of the IC package substrate when the package-HMC assembly is seated in the socket and the IC connector and the socket are mated.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein.

What is claimed is:

1. An integrated circuit (IC) assembly, comprising:
   an IC package substrate having a top surface, a bottom surface, and a side surface, the IC package substrate having first signal contacts on the top surface or the bottom surface, and the bottom surface having second signal contacts for coupling with a socket on a circuit board, wherein a first portion of the top surface and the bottom surface are aligned with the socket along a first axis that is parallel with the side surface, and a second portion of the top surface and the bottom surface are not aligned with the socket along the first axis, and the first signal contacts are positioned on the second portion of the top surface or the bottom surface;
   an intermediate member having a first end and a second end, and a second axis defined between the first and second ends, the first end having signal contacts coupled to the first signal contacts of the IC package substrate, and the second end extending beyond an edge of the IC package substrate defined by the side surface; and
   a male connector, disposed at the second end of the intermediate member, having signal contacts coupled to the signal contacts of the intermediate member, and mateable with a female connector when the female connector is brought into engagement with the male connector in a direction parallel to the second axis.

2. The IC assembly of claim 1, further comprising:
   the female connector, having signal contacts to couple to the signal contacts of the male connector when the female and male connectors are engaged; and
   a cable having signal carriers coupled to the signal contacts of the female connector, the cable extending in a direction parallel to the second axis when the female and male connectors are engaged.

3. The IC assembly of claim 2, wherein the female connector is a low insertion force connector.

4. The IC assembly of claim 2, wherein the cable is a coaxial cable.

5. The IC assembly of claim 2, wherein the cable is a fiber optic cable.

6. The IC assembly of claim 2, wherein the cable is coupled to a switch coupled to multiple processing units.

7. The IC assembly of claim 1, wherein the intermediate member comprises a flexible flat cable.

8. The IC assembly of claim 1, wherein the intermediate member comprises a rigid circuit board.

9. The IC assembly of claim 8, wherein the male connector comprises an extension portion of the rigid circuit board, the extension portion extending away from a body of the rigid circuit board in a direction of the second axis.

10. The IC assembly of claim 1, wherein the circuit board is a motherboard.

* * * * *